(12) United States Patent
Yoshida et al.

(10) Patent No.: US 8,238,183 B2
(45) Date of Patent: Aug. 7, 2012

(54) SEMICONDUCTOR DEVICE AND DATA PROCESSING SYSTEM COMPRISING SEMICONDUCTOR DEVICE

(75) Inventors: Soichiro Yoshida, Tokyo (JP); Kazuhiko Kajigaya, Tokyo (JP); Yasutoshi Yamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/174,888

(22) Filed: Jul. 1, 2011

(65) Prior Publication Data

US 2011/0261631 A1    Oct. 27, 2011

Related U.S. Application Data

(63) Continuation-in-part of application No. 12/881,750, filed on Sep. 14, 2010.

(30) Foreign Application Priority Data

Sep. 15, 2009  (JP) .................................. 2009-213807
Mar. 29, 2011  (JP) .................................. 2011-073655

(51) Int. Cl.
   *G11C 7/06*    (2006.01)
   *G11C 7/00*    (2006.01)

(52) U.S. Cl. ...................................... 365/207; 365/203

(58) Field of Classification Search ............. 365/189.11, 365/230.03, 203, 207
See application file for complete search history.

(56) References Cited

U.S. PATENT DOCUMENTS

| 6,504,776 | B1 * | 1/2003 | Nakaoka ........................ 365/203 |
| 7,193,912 | B2 * | 3/2007 | Obara et al. .................... 365/203 |
| 7,505,346 | B2 * | 3/2009 | Kobayashi .................... 365/207 |
| 7,660,184 | B2 * | 2/2010 | Kobayashi ............... 365/230.03 |
| 2011/0063935 | A1 * | 3/2011 | Yoshida et al. ............... 365/207 |

FOREIGN PATENT DOCUMENTS

JP    2001-57080 A    2/2001

* cited by examiner

*Primary Examiner* — Hoai V Ho
*Assistant Examiner* — Tri Hoang
(74) *Attorney, Agent, or Firm* — Sughrue Mion, PLLC

(57) ABSTRACT

A semiconductor device comprises a sense amplifier circuit amplifying a signal transmitted through the bit line, first/second data lines transmitting the signal amplified by the sense amplifier circuit, a read amplifier circuit driven by a first voltage and amplifying the signal; first/second switch circuits controlling connection between the above components, first/second voltage setting circuits setting the second/third data lines to a second voltage lower than the first voltage. A predetermined voltage obtained by adding the second voltage to a threshold voltage of a transistor in the second/third switch circuit is applied to the gate terminal thereof, and ends of the data lines are connected to the source and drain terminals thereof.

14 Claims, 14 Drawing Sheets

SEMICONDUCTOR DEVICE AND DATA PROCESSING SYSTEM COMPRISING SEMICONDUCTOR DEVICE

CROSS REFERENCE TO RELATED APPLICATIONS

The present application is a continuation-in-part of U.S. patent application Ser. No. 12/881,750, filed on Sep. 14, 2010, the disclosure of which is incorporated herein in its entirety by reference. This application is based upon and claims the benefit of priority from Japanese Patent Application Nos. 2011-073655, filed on Mar. 29, 2011, and JP 2009-213807 filed on Sep. 15, 2009, the disclosures of which are incorporated herein in their entirety by reference.

BACKGROUND OF THE INVENTION

1. Field of the Invention

The present invention relates to a semiconductor device having a configuration in which a signal readout from a memory cell and transmitted through a bit line is amplified by a sense amplifier.

2. Description of Related Art

Conventionally, a configuration of a semiconductor memory device such as a DRAM is known in which a sense amplifier sensing and amplifying a signal readout from a memory cell through a bit line and a read circuit transmitting an output signal of the sense amplifier to a final stage amplifier through hierarchical data lines (Refer to, for example, Japanese Patent Application Laid-open No. 2001-57080). In the above conventional read circuit, the output signal of the sense amplifier is transmitted sequentially from a local data line to a main data line and inputted to the final stage amplifier. Generally, an N-channel type transistor as a transfer gate is used to connect between the local data line and the main data line or between each data line and a node in the final stage amplifier. In this case, a configuration in which the N-channel type transistor is replaced with a P-channel type transistor can be employed, or a configuration in which both the N-channel type transistor and the P-channel type transistor are used can be employed. Or, a configuration is known in which a sub amplifier is provided halfway in the local/main data lines so as to secondarily amplify the transmission signal in order to prevent a decrease in reading speed due to an increase in parasitic capacitance.

For example, in an example case where a signal is transmitted sequentially through a pair of local data lines and a pair of main data lines corresponding to a complementary pair of bit lines, the output signal of the sense amplifier which is selected by a column select signal is sequentially transmitted as a voltage difference of each pair of the data lines. At this point, the pair of main data lines are previously precharged to a predetermined voltage and the voltage difference is generated by drawing charge from one of the pair of main data lines. Then, the voltage difference is transmitted to the final stage amplifier through the transfer gate, and data can be outputted to outside with a desired amplitude.

However, an external supply voltage or an internal supply voltage obtained by stepping down the external supply voltage is supplied to the above read circuit, and a gate voltage for turning on the N-channel type transistor as the transfer gate is controlled based on the supply voltage. Therefore, the voltage difference of the main data lines having a large parasitic capacitance is required to have a sufficiently large amplitude in order that an amplitude at the final stage amplifier becomes sufficiently large, and there has been an event that an operation current required in a precharge operation or the like increases. Particularly, influence of the increase in the operation current becomes large when the number of output bits is increased with the improvement of integration of the semiconductor memory device.

Further, when data is sensed by using a charge transfer transistor, it is required to suppress a decrease in transfer ability of the charge transfer transistor, which is caused by gate coupling with which a potential of its gate terminal is influenced by a voltage transition of source or drain terminal of the charge transfer transistor.

SUMMARY

The present invention seeks to solve at least one of the above problems and provides a semiconductor device capable of suppressing an increase in operating current due to an increase in signal amplitude when the signal is transmitted through hierarchical data lines from a sense amplifier.

One of aspects of the invention is a semiconductor device capable of selectively reading and transmitting data stored in a plurality of memory cells through a bit line, the semiconductor device comprising: a sense amplifier circuit amplifying a signal transmitted through the bit line; a first data line transmitting the signal amplified by the sense amplifier circuit; a second data line transmitting the signal transmitted through the first data line; a read amplifier circuit driven by a first voltage, the read amplifier amplifying the signal transmitted through the second data line; a first switch circuit controlling an electrical connection between corresponding ends of an output node of the sense amplifier circuit and the first data line; a second switch circuit controlling an electrical connection between corresponding ends of the first and second data lines; a third switch circuit controlling an electrical connection between corresponding ends of the second data line and an input node of the read amplifier circuit; a first voltage setting circuit setting the first data line to a second voltage lower than the first voltage; and a second voltage setting circuit setting the second data line to the second voltage. In the semiconductor device of the invention, each of the second and third switch circuits includes a first transistor having a gate terminal, a source terminal and a drain terminal, and a predetermined voltage obtained by adding the second voltage to a threshold voltage of the first transistor is applied to the gate terminal thereof, and the corresponding ends are connected to the source and drain terminals thereof.

According to the one of aspects of the invention, a signal read out from a memory cell to a bit line is amplified by a sense amplifier, and is transmitted to a read amplifier circuit through a first switch circuit, a first data line, a second switch circuit, a second data line and a third switch circuit. In this operation, first/second voltage setting circuits set the first/second data liens to a second voltage, and second/third switches become a conductive state when a gate voltage is controlled to be a predetermined voltage obtained by adding a threshold voltage to a second voltage. Thereby, the read amplifier circuit is driven by the first voltage higher than the second voltage, and the signal can be transmitted through the first/second data lines with a smaller amplitude in comparison with a conventional configuration with a small amplitude. Therefore, it is possible to sufficiently suppress an increase in operating current due to an increase in parasitic capacitance.

Another aspect of the invention is a semiconductor device capable of selectively reading and transmitting data stored in a plurality of memory cells through a bit line, the semiconductor device comprising: a sense amplifier circuit amplifying a signal transmitted through the bit line; a first data line transmitting the signal amplified by the sense amplifier circuit; a second data line transmitting the signal transmitted through the first data line; a read amplifier circuit driven by a first voltage, the read amplifier amplifying the signal transmitted through the second data line; a first switch circuit controlling an electrical connection between an output node of the sense amplifier circuit and a one end of the first data line; a second switch circuit controlling an electrical connection between an other end of the first data line and a one end of the second data line; a third switch circuit controlling an electrical connection between an other end of the second data line and a first node; a charge transfer transistor controlling a charge transfer between the first node and an input node of the read amplifier circuit in response to a control voltage applied to a gate terminal; a first voltage setting circuit setting the first data line to a second voltage lower than the first voltage; a second voltage setting circuit setting the second data line to the second voltage; a control voltage generating circuit generating the control voltage having a fixed voltage obtained by adding the second voltage to a threshold voltage of the charge transfer transistor; and a compensation capacitor formed at a line that supplies a the control voltage from the control voltage generating circuit to the charge transfer transistor, wherein each of the second and third switch circuits includes a first transistor having a gate terminal, a source terminal and a drain terminal, and a signal having a high-level voltage of a predetermined voltage is applied to the gate terminal of the first transistor, the predetermined voltage being obtained by the first voltage or adding the second voltage to a threshold voltage of the first transistor.

According to the another aspect of the invention, in addition to the above operation, charge transfer between the first node and the input node of the read amplifier circuit is performed by applying the control voltage to the gate of the charge transfer transistor. At this point, the control voltage is set to the fixed voltage obtained by adding the second voltage to the threshold voltage of the charge transfer transistor. By providing the charge transfer transistor, a decrease in operating margin caused by gate coupling can be prevented when the potential of the input node of the read amplifier transitions from a high level to a low level, and it is possible to prevent malfunction of the read amplifier circuit due to a decrease in potential of the input node of the read amplifier that is caused by off current of the charge transfer transistor.

The present invention can be applied to a case in which a pair of data lines provided corresponding to a complementary pair of bit lines, and a differential sense amplifier circuit and a differential read amplifier circuit are configured. The present invention can be also applied to a case in which the signal is sequentially transmitted through single ended data lines corresponding to a single ended bit line, and a single ended sense amplifier circuit and a single ended read amplifier circuit are configured.

Further, the present invention can be effectively applied to a data processing system comprising the semiconductor device, in addition to the above semiconductor device.

As describe above, according to the present invention, when the signal from the sense amplifier circuit to the read amplifier circuit through hierarchical data lines, the gate voltage applied to transistors included in the second/third switch circuits can be relatively small, and thus the operating current required for a precharge operation or the like can be reduced. Particularly, in a case where the parasitic capacitance increases due to a long main data line, or a case where the number of output bits to be read simultaneously is increased, the effect of reducing the operation current in the present invention can be drastic. Further, high-speed sensing can be achieved for the signal with a small amplitude which is half the small amplitude in the conventional configuration.

Furthermore, according to the invention, influence of the gate coupling of the charge transfer transistor can be suppressed, and it is possible to obtain excellent efficiency of the charge transfer so as to achieve sufficient operating margin.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

Typical examples of a technical idea solving the problems of the present invention will be shown. However, it goes without saying that the present invention is not limited to the examples of this technical idea and consists in the scope of the claimed invention.

The technical idea of the present invention is applied to a semiconductor device in which a sense amplifier circuit (20), a first data line (LIOT, LIOB), a second data line (MIOT, MIOB) and a read amplifier circuit (21) are provided, a first switch circuit (Q10, Q11), a second switch circuit (Q14, Q15) and a third switch circuit (Q18, Q19) respectively controlling connection of the data lines are additionally provided, and further a first voltage setting circuit (Q12, Q13) and a second voltage setting circuit (Q16, Q17) respectively setting the data liens to a second voltage (VBLP) are provided. In the semiconductor device, when transistors (Q14, Q15, Q18, Q19) included in the second/third switch circuits become conductive, the gate voltage thereof are controlled to be a predetermined voltage obtained by adding each threshold voltage of the transistors to the second voltage (VBLP), and the second voltage (VBLP) applied to sources of the transistors is set lower than the first voltage (VPERI) for driving the read amplifier circuit (21). By this configuration, an amplitude of a signal transmitted from the first data line (LIOT, LIOB) to the second data line (MIOT, MIOB) can be smaller than that of a signal in the read amplifier circuit (21), which is effective to reduce operating current.

In a first embodiment, high-level data (the second data of the invention) of a memory cell is indirectly transmitted to an input terminal (RAT) of the read amplifier circuit without being amplified. On the other hand, low-level data (the first data of the invention) of the memory cell is amplified with a small amplitude and is directly transmitted to the input terminal (RAT) of the read amplifier circuit.

In a second embodiment, in a read operation of low-level data (the second data of the invention) of the memory cell, the low-level data of the memory cell is indirectly transmitted to an input terminal (N2) of the read amplifier circuit without being amplified. On the other hand, in a read operation of high-level data (the first data of the invention) of the memory cell, the high-level data of the memory cell is amplified with a small amplitude and is directly transmitted to the input terminal (N2) of the read amplifier circuit.

Figure 10:
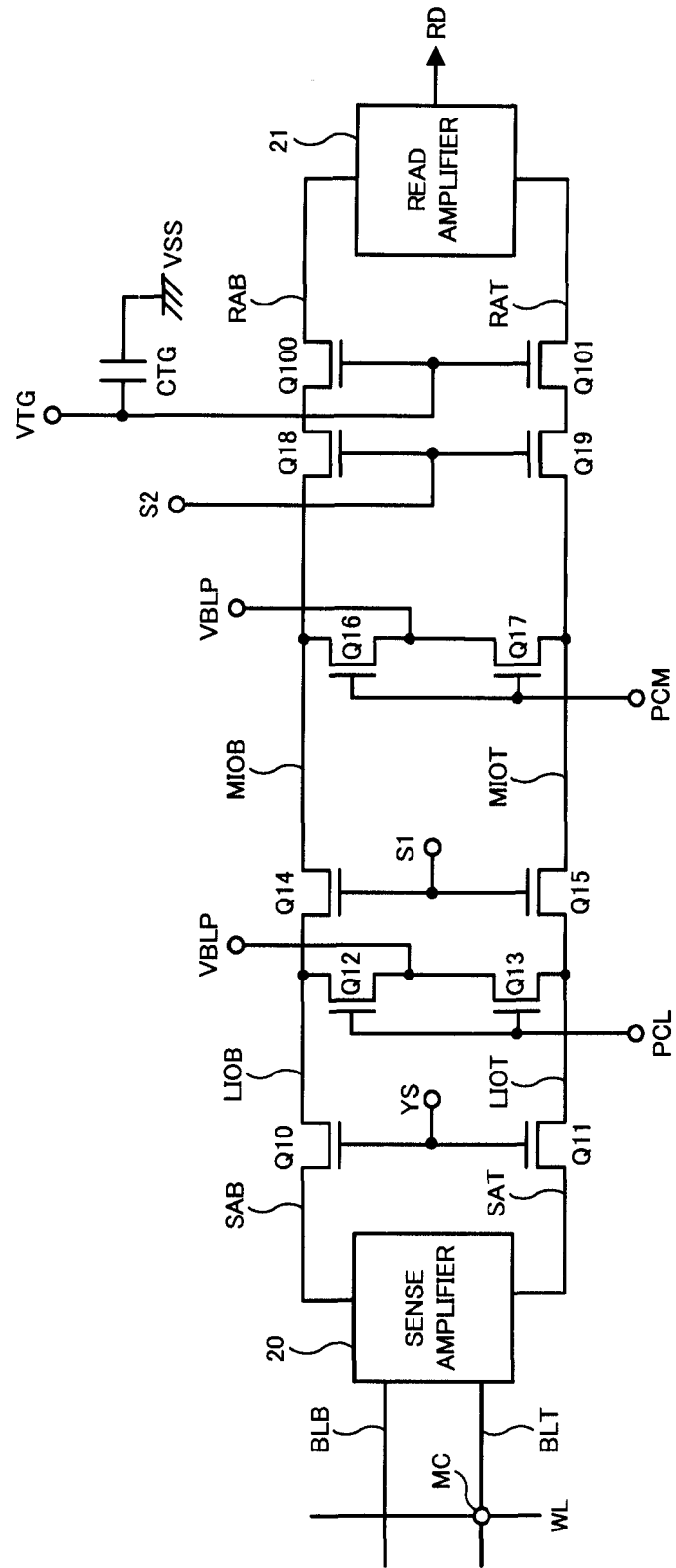
FIG. 10 is a diagram showing a specific circuit configuration of a portion of the read circuit in the DRAM of the third embodiment.

Another technical idea is applied to a semiconductor device in which a sense amplifier circuit (20), a first data line (LIOT, LIOB), a second data line (MIOT, MIOB) and a read amplifier circuit (21), a first switch circuit (Q10, Q11), a second switch circuit (Q14, Q15) and a third switch circuit (Q18, Q19) respectively controlling connection of the data lines, a charge transfer transistor (Q100, Q101), and a first voltage setting circuit (Q12, Q13) and a second voltage setting circuit (Q16, Q17) respectively setting the data liens to a second voltage (VBLP) are provided (for example, refer to FIG. 10). In addition to these, a control voltage generating circuit generating a control voltage (VTG) applied to a gate terminal of the charge transfer transistor and a compensation capacitor (CTG) formed at a line for supplying the control voltage to the gate terminal of the charge transfer transistor are provided in the semiconductor device.

In the above configuration, respective potentials of the first data line (LIOT, LIOB) and the second data line (MIOT, MIOB) are set to the second voltage (VBLP) lower than the first voltage for driving the read amplifier circuit (21), the gate voltage to turn on the transistors (Q14, Q15, Q18, Q19) included in the second/third switch circuits is controlled to be the predetermined voltage obtained by the first voltage or adding the second voltage to a threshold voltage of the transistors, and the control voltage (VTG) being a gate potential of the charge transfer transistor (Q100, Q101) is set to a fixed voltage obtained by adding the second voltage to a threshold voltage thereof. Further, the control voltage (VTG) is set to the fixed voltage and a compensation capacitor is formed at a line of the fixed voltage. Therefore, it is possible to suppress influence of gate coupling due to voltage change of an input node (RAB, RAT) in a read operation, thereby obtaining sufficient operating margin.

The following U.S. patent applications are hereby incorporated by reference in its entirety as though fully and completely set forth herein.
(1) U.S. patent application Ser. No. 12/461,858 filed Aug. 26, 2009 entitled Sense Amplifier Circuit And Semiconductor Memory Device, to Kazuhiko Kajigaya.
(2) U.S. patent application Ser. No. 12/382,494 filed Mar. 17, 2009 entitled Semiconductor Device Having Single-Ended Sensing Amplifier, to Kazuhiko Kajigaya and Soichiro Yoshida.
(3) U.S. patent application Ser. No. 12/416,432 filed Apr. 1, 2009 entitled Semiconductor Memory Device, to Kazuhiko Kajigaya, Soichiro Yoshida, Tomonori Sekiguchi, Riichiro Takemura and Yasutoshi Yamada.
(4) U.S. patent application Ser. No. 12/382,493 filed Mar. 17, 2009 entitled Semiconductor Device Having Single-Ended Sensing Amplifier, to Kazuhiko Kajigaya.
(5) U.S. patent application Ser. No. 12/461,859 filed Aug. 26, 2009 entitled Sense Amplifier Circuit And Semiconductor Memory Device, to Kazuhiko Kajigaya.

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, the present invention is applied to a DRAM (Dynamic Random Access Memory) as an example of a semiconductor device.

First Embodiment

Figure 1:
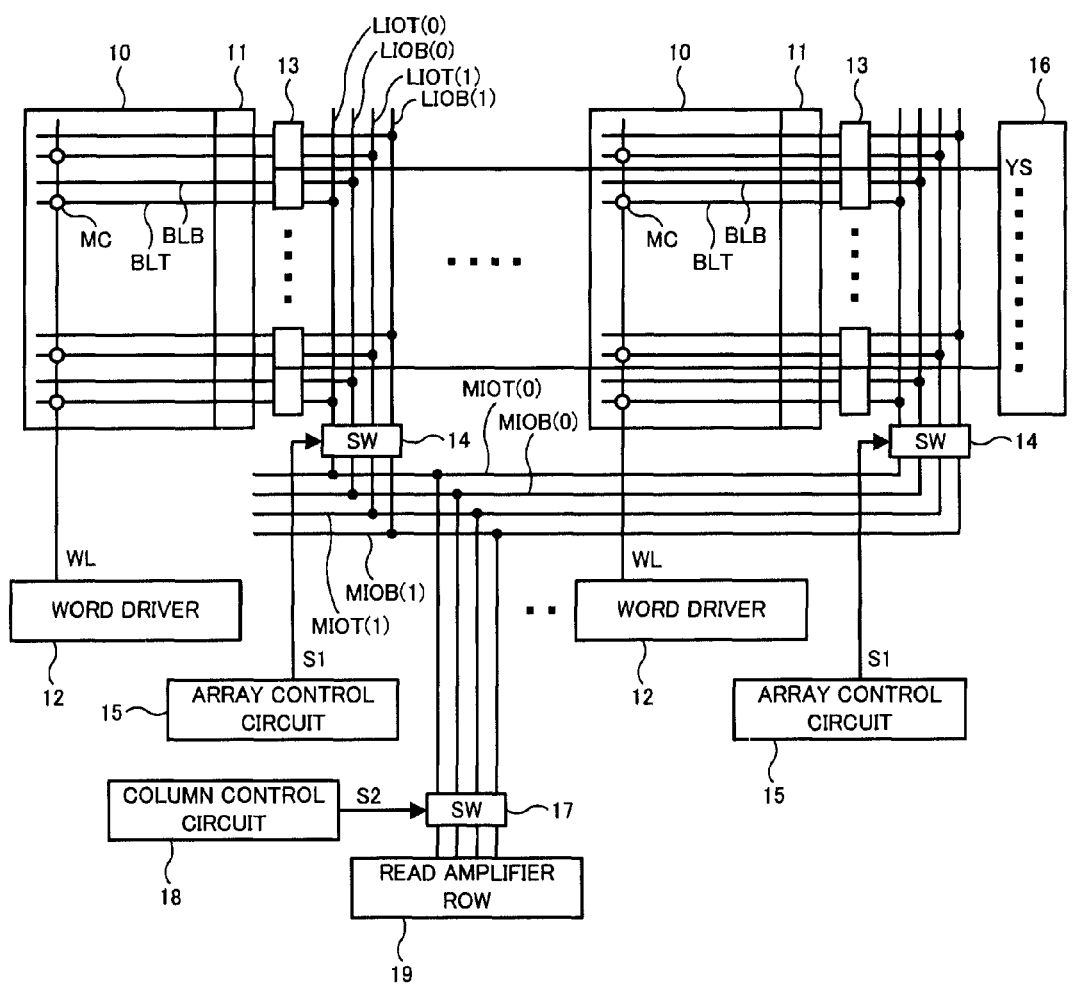
FIG. 1 is a block diagram of an entire configuration of column circuits in a DRAM of a first embodiment.

The first embodiment of the present invention will be described below. FIG. 1 is a block diagram mainly showing an entire configuration of column circuits in a DRAM of the first embodiment. In the block diagram of FIG. 1, a plurality of memory cell arrays 10 are provided, and a sense amplifier row 11, a word driver 12, a predetermined number of column select circuits 13, a switch circuit 14 and an array control circuit 15 are provided attached to each of the memory cell arrays 10. Further, a column decoder 16, a switch circuit 17, a column control circuit 18 and a read amplifier row 19 are provided attached to the entire column circuits. The plurality of memory cell arrays 10 are arranged in a bit line direction together with the sense amplifier rows 11 in the layout of the DRAM.

In each of the memory cell arrays 10, a plurality of word lines WL and a plurality of bit lines BLT/BLB intersecting the word lines WL are arranged, and a plurality of memory cells MC are formed at every two intersections. An adjacent pair of bit lines BLT/BLB forms a complementary pair and is connected to each sense amplifier included in the sense amplifier row 11. A word line WL selected in the memory cell array 10 is driven by the word driver 12 and a signal is read out from a corresponding memory cell MC as a voltage difference of the pair of bit lines BLT/BLB. Then, the sense amplifier connected to the pair of bit line BLT/BLB amplifies and latches the read out signal.

The column select circuit 13 controls connection between the bit lines BLT/BLB and local data lines LIOT/LIOB in response to a column select signal YS supplied from the column decoder 16. The column decoder 16 is arranged at one end of the plurality of memory cell arrays 10 and activates one column select signal YS corresponding to a decoding result of a Y address among a plurality of column select signals YS. In the example of FIG. 1, a pair of local data lines LIOT(0)/LIOB(0) and a pair of local data lines LIOT(1)/LIOB(1) are arranged in parallel corresponding to each of the memory cell arrays 10. Thus, two pairs of (four) bit lines BLT/BLB and two pairs of (four) local data lines LIOT/LIOB are connected to each column select circuit 13.

The switch circuit 14 controls connection between the local data lines LIOT/LIOB and the main data lines MIOT/MIOB in response to a control signal S1 supplied from the array control circuit 15. In the example of FIG. 1, a pair of main data lines MIOT(0)/MIOB(0) corresponding to the pair of local data lines LIOT(0)/LIOB(0) and a pair of main data lines MIOT(1)/MIOB(1) corresponding to the pair of local data lines LIOT(1)/LIOB(1) are arranged in parallel. Thus, two pairs of (four) local data lines LIOT/LIOB and two pairs of (four) main data lines MIOT/MIOB are connected to each other.

In the first embodiment, it will be assumed that the pair of local data lines LIOT/LIOB and the pair of main data lines MIOT/MIOB exist in the following description of configuration and operation. However, in a case where two or more pairs of respective lines are arranged, configuration and operation are the same for each pair.

The switch circuit 17 controls connection between the main data lines MIOT/MIOB and the read amplifier row 19 in response to a control signal S2 supplied from the column control circuit 18. The read amplifier row 19 includes two read amplifiers which amplify signals transmitted through the pair of main data lines MIOT(0)/MIOB(0) and the pair of main data lines MIOT(1)/MIOB(1) respectively.

Figure 2:
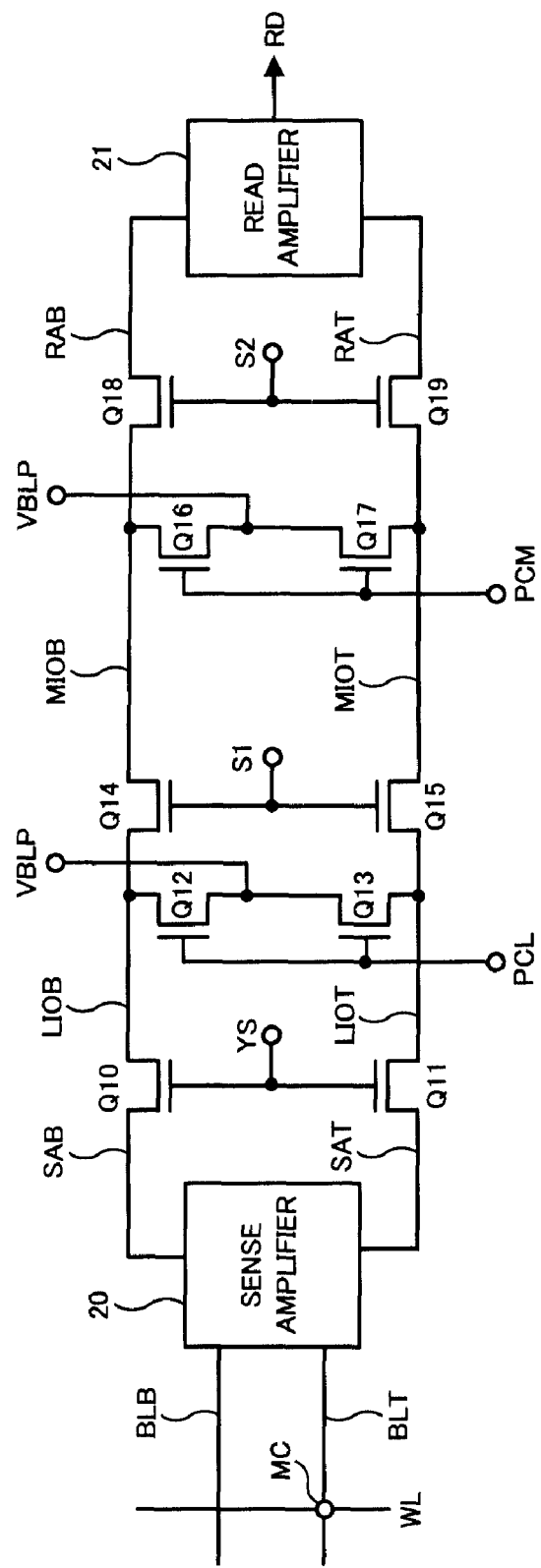
FIG. 2 is a diagram showing a specific circuit configuration of a portion of a read circuit in the DRAM of the first embodiment.

FIG. 2 shows a specific circuit configuration of a portion of the read circuit in the DRAM of the first embodiment. The circuit configuration of FIG. 2 includes one sense amplifier 20 in the sense amplifier row 11, a pair of local data lines LIOT/LIOB (the first data lines of the invention) and a pair of main data lines MIOT/MIOB (the second data line of the invention) sequentially connected from the sense amplifier 20, circuit portions corresponding to the column select circuit 13 and the switch circuits 14, 17, and one read amplifier 21 in the read amplifier row 19, and 10 transistors Q10 to Q19 in total are provided, in the block diagram shown in FIG. 1. In addition, one pair of bit lines BLT/BLB connected to the sense amplifier 20 and one memory cell MC arranged at an intersection of a word line WL and a bit line BLT are also shown in FIG. 2. Here, various circuit configurations may be employed for the sense amplifier 20. For example, a well-known circuit configuration in which the bit lines BLT/BLB as input nodes of the sense amplifier 20 and output nodes SAT/SAB thereof are commonly connected and inputs and outputs of two inverters are cross-coupled (circuit configuration in which the input nodes and the output nodes are respectively common) may be employed, or a circuit configuration in which the input nodes and the output nodes are separated may be employed.

A pair of N-channel type transistors Q10 and Q11 (the first switch circuit of the invention) is included in the column select circuit 13 of FIG. 1. One transistor Q10 has a source (one terminal) and a drain (the other terminal) connected between one output node SAB of the sense amplifier 20 and one local data line LIOB. The other transistor Q11 has a source (one terminal) and a drain (the other terminal) connected between the other output node SAT of the sense amplifier 20 and the other local data line LIOT. The column select signal YS is applied to gates of both transistors Q10 and Q11.

A pair of output nodes SAT/SAB of the sense amplifier 20 and the pair of local data lines LIOT/LIOB are connected to each other when the column select signal YS is at a high level which is equal to or larger than a level of an internal supply voltage VPERI (the first voltage of the invention or a greater voltage), and are disconnected from each other when the column select signal YS is at a low level. Here, "gate terminal" may be simply referred to as "gate", "source terminal" maybe simply referred to as "source", and "drain terminal" may be simply referred to as "drain".

A pair of N-channel type transistors Q12 and Q13 (the first voltage setting circuit of the invention) is connected in series between the pair of local data lines LIOT/LIOB. These transistors Q12 and Q13 has a gate to which a control signal PCL is applied and a source to which a precharge voltage VBLP (the second voltage of the invention) is applied. When the control signal PCL is at a high level, the pair of local data lines LIOT/LIOB is precharged to the precharge voltage VBLP via the transistors Q12 and Q13.

A pair of N-channel type transistors Q14 and Q15 (the second switch circuit of the invention; the first transistor) is included in the switch circuit 14 of FIG. 1. One transistor Q14 has a source (one terminal) and a drain (the other terminal) connected between one local data line LIOB and one main data line MIOB. The other transistor Q15 has a source (one terminal) and a drain (the other terminal) connected between the other local data line LIOT and the other main data line MIOT. The control signal S1 is applied to gates of both transistors Q14 and Q15. The pair of local data lines LIOT/LIO and the pair of main data lines MIOT/MIOB are electrically connected to each other when the control signal S1 is at the high level, and are electrically disconnected from each other when the control signal S1 is at the low level.

A pair of N-channel type transistors Q16 and Q17 (the second voltage setting circuit of the invention) is connected in series between the pair of main data lines MIOT/MIOB. Each of these transistors Q16 and Q17 has a gate to which a control signal PCM is applied and a source to which the precharge voltage VBLP is applied. When the control signal PCM is at the high level, the pair of main data lines MIOT/MIOB is precharged to the precharge voltage VBLP via the transistors Q16 and Q17.

A pair of N-channel type transistor Q18 and Q19 (the third switch circuit of the invention; the first transistor) is included in the switch circuit 17 of FIG. 1. One transistor Q18 has a source (one terminal) and a drain (the other terminal) connected between one main data line MIOB and one node RAB of the read amplifier 21. The other transistor Q19 has a source (one terminal) and a drain (the other terminal) connected between the other main data line MIOT and the other node RAT of the read amplifier 21. The control signal S2 is applied to gates of both transistors Q18 and Q19. The pair of main data lines MIOT/MIOB and the pair of nodes RAT/RAB of the read amplifier 21 are electrically connected to each other when the control signal S2 is at the high level, and are electrically disconnected from each other when the control signal S2 is at the low level. Then, the read amplifier 21 outputs data RD.

In addition, the read amplifier 21 is driven by the internal supply voltage VPERI (the first voltage of the invention), and the pair of nodes RAT/RAB is precharged to the internal supply voltage VPERI by a voltage setting circuit (not shown) inside the read amplifier 21. In the embodiments, a relation VPERI>VBLP is assumed. For example, VPERI=1V and VBLP=0.5V are set. In this example, the precharge voltage VBLP is set to an intermediate voltage between the internal supply voltage VPERI and a ground potential. However, without being limited to this setting, desired relations of voltages that satisfy VPERI>VBLP can be set, as long as effects of the present invention are achieved. In addition, the read amplifier 21 may have a configuration in which the input nodes and the output nodes are common, or have a configuration in which the input nodes and the output nodes are separated.

Figure 3:
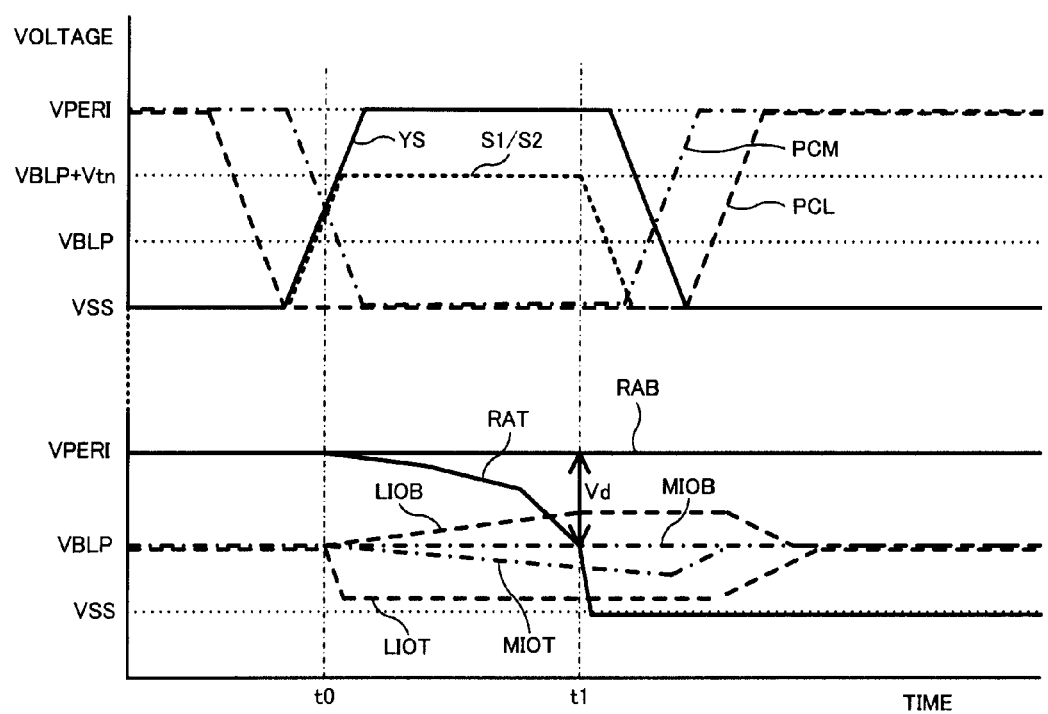
FIG. 3 is a diagram showing operation waveforms of various parts of the read circuit of FIG. 2 corresponding to an operation to read low-level data from a sense amplifier.

Next, an operation of the read circuit of FIG. 2 will be described with reference to FIG. 3. FIG. 3 shows operation waveforms of various parts of the read circuit of FIG. 2, which correspond to an operation when low-level data (the first data of the invention) is read out from the sense amplifier 20. The operation waveforms are represented separately in upper and lower parts of FIG. 3. The column select signal YS, the control signals S1/S2 and the control signals PCL/PCM are respectively represented in the upper part of FIG. 3, and the local data lines LIOT/LIOB, the main data lines MIOT/MIOB and the nodes RAT/RAB in the read amplifier 21 are respectively represented in the lower part of FIG. 3. In addition, high level of most of the operation waveforms in FIG. 3 is the internal supply voltage VPERI, while low level thereof is the ground potential VSS.

In an initial period of FIG. 3, since the control signals PCL/PCM are both at the high level, the local data lines LIOT/LIOB and the main data lines MIOT/MIOB are both in a state of being precharged to the precharge voltage VBLP. The bit lines BLT/BLB and the output nodes SAT/SAB of the sense amplifier 20 are precharged to the internal supply voltage VPERI by the voltage setting circuit. Then, when a read command is inputted, the control signal PCL is changed to the low level and the precharging of the local data lines LIOT/LIOB is cancelled. Subsequently, the column select signal YS is changed to the high level at timing t0, and the control signal PCM is changed to the low level. At this point, the precharging of the main data lines MIOT/MIOB is cancelled, and the control signals S1/S2 are controlled to be a voltage VBLP+Vtn (the predetermined voltage of the invention) which is obtained by adding a threshold voltage Vtn (the threshold voltage of the first transistor of the invention) of an N-channel type transistor to the precharge voltage VBLP. Thus, the low-level data latched in the sense amplifier 20 is read out to the read amplifier 21 sequentially through the output nodes SAT/SAB, the local data lines LIOT/LIOB, the main data lines MIOT/MIOB and the nodes RAT/RAB, as described later. For example, if Vtn is 0.1 v, the predetermined voltage is 0.6 v.

At timing t0, the potential of the local data line LIOT is changed from the precharge voltage VBLP to the low level (the third voltage of the invention) in the first direction in the read operation of the low-level data from the sense amplifier 20, and the potential of the main data line MIOT is gradually lowered to the low level (the fifth voltage of the invention) in the first direction via the transistor Q15. Meanwhile, the output node SAB of the sense amplifier 20 becomes the high level in the second direction whose polarity is reverse to that of the output node SAT, and the potential of the local data line LIOB gradually rises to the high level (the fourth voltage of the invention) in the second direction via the transistor Q10. Therefore, the transistor Q14 is not turned on, and the main data line MIOB is maintained at the precharge voltage VBLP. In addition, rates of change of the above potentials are influenced by magnitudes of parasitic capacitances and conductive resistance values of the transistors.

Since the potential of the main data line MIOT becomes the fifth voltage lower than the precharge voltage VBPL, the transistor Q19 turns on so that charge begins to be drawn from the node RAT of the read amplifier 21. That is, the charge drawn along a path of the main data line MIOT and the local data line LIOT is supplied from the node RAT (charge sharing). Therefore, the potential of the main data line MIOT changes with a small amplitude (between the precharge voltage VBLP and the fifth voltage), and in contrast the potential of the node RAT having parasitic capacitance much smaller than that of the main data line MIOT changes with a large amplitude. As a result, a large voltage difference (Vd) appears between the pair of nodes RAT/RAB. As shown in FIG. 3, since a required voltage difference Vd is obtained between the pair of nodes RAT/RAB at timing t1, a signal corresponding to the voltage difference Vd is latched by activating the read amplifier 21.

The control signals S1/S2 are changed from the above voltage VBLP+Vtn to the low level at the timing t1. Subsequently, when the column select signal YS is changed from the high level to the low level, the control signal PCM is changed from the low level to the high level. Thereafter, the control signal PCL is also changed from the low level to the high level. By controlling in this manner, the output nodes SAT/SAB of the sense amplifier 20, the local data lines LIOT/LIOB, the main data lines MIOT/MIOB, and the nodes RAT/RAB of the read amplifier 21 are disconnected from one another and shift to the precharge state again, respectively. In addition, by always maintaining the control signal S1 at the high level, the first voltage setting circuit (transistors Q12 and Q13) and the second voltage setting circuit (transistors Q16 and Q17) can be commonly used.

Regarding an operation for a case where high-level data (the second data of the invention) is read out from the sense amplifier 20, behaviors of the bit lines BLT/BLB, the local data lines LIOT/LIOB and the main data lines MIOT/MIOB are reverse to those in the case where the low-level data (the first data of the invention) is read out from the sense amplifier 20.

As described above, in the configuration of the first embodiment, the read amplifier 21 is driven by the internal supply voltage VPERI, and in a state where the pair of local data lines LIOT/LIOB and the pair of main data lines MIOT/MIOB are set to the precharge voltage VBLP (VBLP<VPERI), the second switch circuit (transistors Q14 and Q15) and the third switch circuit (transistors Q18 and Q19) are controlled to become conductive by setting the voltage VBLP+Vtn. Therefore, the signal transmitted from the sense amplifier 20 through the respective data lines can be sent to the read amplifier 21 in a state of having a small amplitude. That is, in the read operation of the low-level data (the first data of the invention) from the sense amplifier 20, the potentials of the main data line MIOB and the node RAB of the read amplifier 21, which are inverted from the transmitted signal, can be maintained at the voltage VBLP without fluctuation, and the data of the memory cell MC is indirectly transmitted to the read amplifier circuit. On the other hand, the potentials of the main data line MIOT and the node RAT of the read amplifier 21, which are in phase with the transmitted signal, can be enlarged in amplitude, and the data of the memory cell MC is directly transmitted to the read amplifier circuit. In other words, the high-level data of the memory cell MC is indirectly transmitted to the input terminal (node RAT) of the read amplifier circuit without being amplified. On the other hand, the low-level data of the memory cell MC is amplified with the small amplitude and is directly transmitted to the input terminal (node RAT) of the read amplifier circuit. In this case, the amplitude for the main data lines MIOT/MIOB, which is generally regarded to have a large parasitic capacitance, can be reduced to at least half that of the conventional configuration, thereby achieving a great effect of reducing operating current.

Second Embodiment

The second embodiment of the present invention will be described below. In the second embodiment, there is not provided a complementary configuration (T/B) using the pair of local data lines LIOT/LIOB and the pair of main data lines MIOT/MIOB as in the first embodiment. In contrast, the second embodiment employs a single ended configuration using one local data line LIO and one main data line MIO, and has a feature that an amplifier 22 is arranged between the main data line MIO and the read amplifier 21a. In addition, components of the block diagram of FIG. 1 are common in the second embodiment if circuit portions corresponding to the bit line BL, the local data line LIO and the main data line MIO are replaced with single ended circuit configurations, so description thereof will be omitted.

Figure 4:
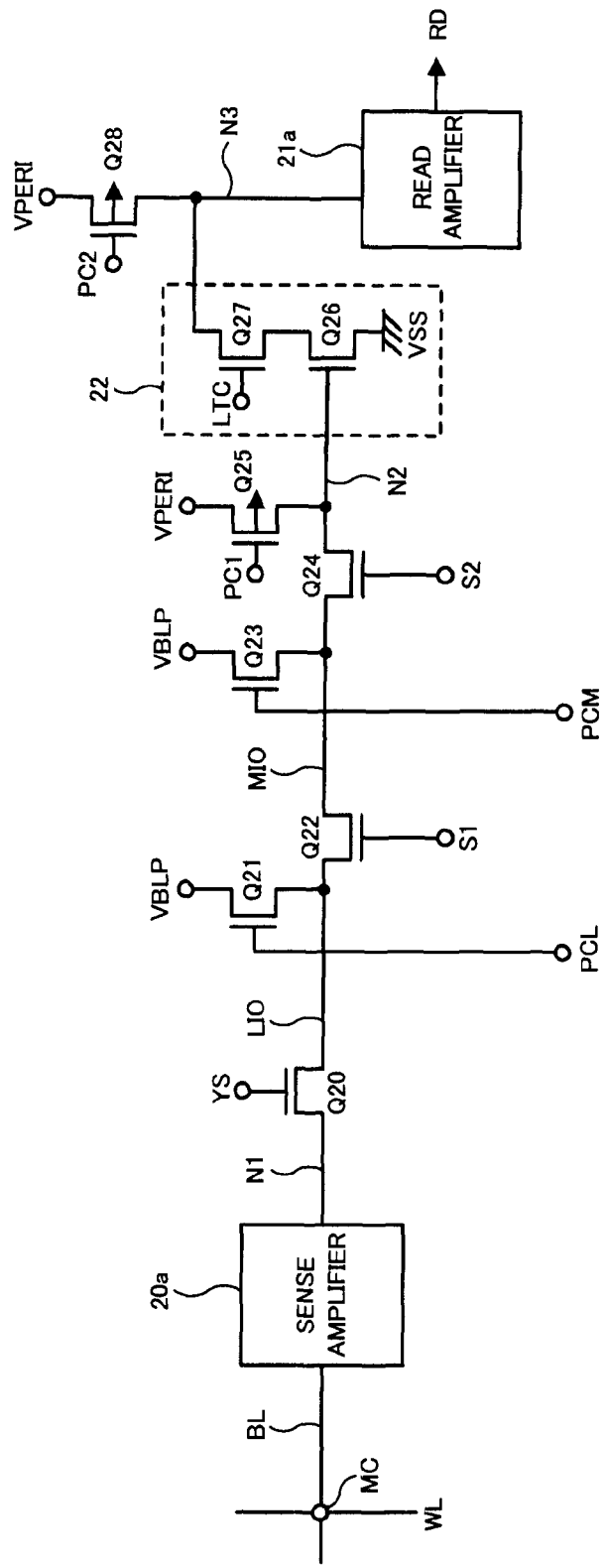
FIG. 4 is a diagram showing a specific circuit configuration of a portion of a read circuit in a DRAM of a second embodiment.

FIG. 4 shows a specific circuit configuration of a portion of the read circuit in the DRAM of the second embodiment. The circuit configuration of FIG. 4 corresponds to the same range in FIG. 2 of the first embodiment, which includes one sense amplifier 20a, one local data line LIO (the first data line of the invention), one main data line MIO (the second data line of the invention), circuit portions corresponding to the switch circuits 14, 17, one amplifier 22, and one read amplifier 21a, and nine transistors Q20 to Q28 in total are provided therein.

The sense amplifier 20a is connected to one bit line BL, amplifies a signal transmitted from a memory cell MC at an intersection of a selected word line WL, and outputs the signal to an output node N1. In the second embodiment, the sense amplifier 20a has a single ended configuration, and a specific configuration example thereof will be described later. The N-channel type transistor Q20 (the first switch circuit of the invention) is connected between the output node N1 of the sense amplifier 20a and the local data line LIO, and the column select signal YS is applied to its gate.

The N-channel type transistor Q21 (the first voltage setting circuit of the invention) is connected between the precharge voltage VBLP and the local data line LIO, and the control signal PCL is applied to its gate. When the control signal PCL is at the high level, the local data line LIO is precharged to the voltage VBLP. The N-channel type transistor Q22 (the second switch circuit of the invention) controls connection between the local data line LIO and the main data line MIO in response to the control signal S1 applied to its gate.

The N-channel type transistor Q23 (the first voltage setting circuit of the invention) is connected between the precharge voltage VBLP and the main data line MIO, and the control signal PCM is applied to its gate. When the control signal PCM is at the high level, the main data line MIO is precharged to the precharge voltage VBLP. The N-channel type transistor Q24 (the third switch circuit of the invention) controls connection between the main data line MIO and a node N2 of the amplifier 22 in response to the control signal S2 applied to its gate. The P-channel type transistor Q25 controls connection between the internal supply voltage VPERI and the node N2, and a control signal PC1 is applied to its gate. When the control signal PC1 is at the low level, the node N2 is precharged to the internal supply voltage VPERI.

The amplifier 22 is a single ended amplifier and is composed of two N-channel type transistor Q26 and Q27 connected in series between a node N3 and the ground potential VSS. The gate of the transistor Q26 is connected to the node N2, a control signal LTC is applied to the gate of the transistor Q27, and an input signal via the node N2 is amplified and outputted to the node N3 as one terminal of the transistor Q27. Here, the order of the series connected transistors Q26 and Q27 can be reversed.

The P-channel type transistor Q28 is connected between the internal supply voltage VPERI and the node N3, and a control signal PC2 is applied to its gate. When the control signal PC2 is at the low level, the node N3 is precharged to the internal supply voltage VPERI. The node N3 is connected to an input terminal of the read amplifier 21a, and data RD is outputted from the read amplifier 21a. In addition, the read amplifier 21a, the single ended amplifier 22, and the transistors Q25 and Q28 function integrally as the read amplifier circuit of the present invention.

Figure 5:
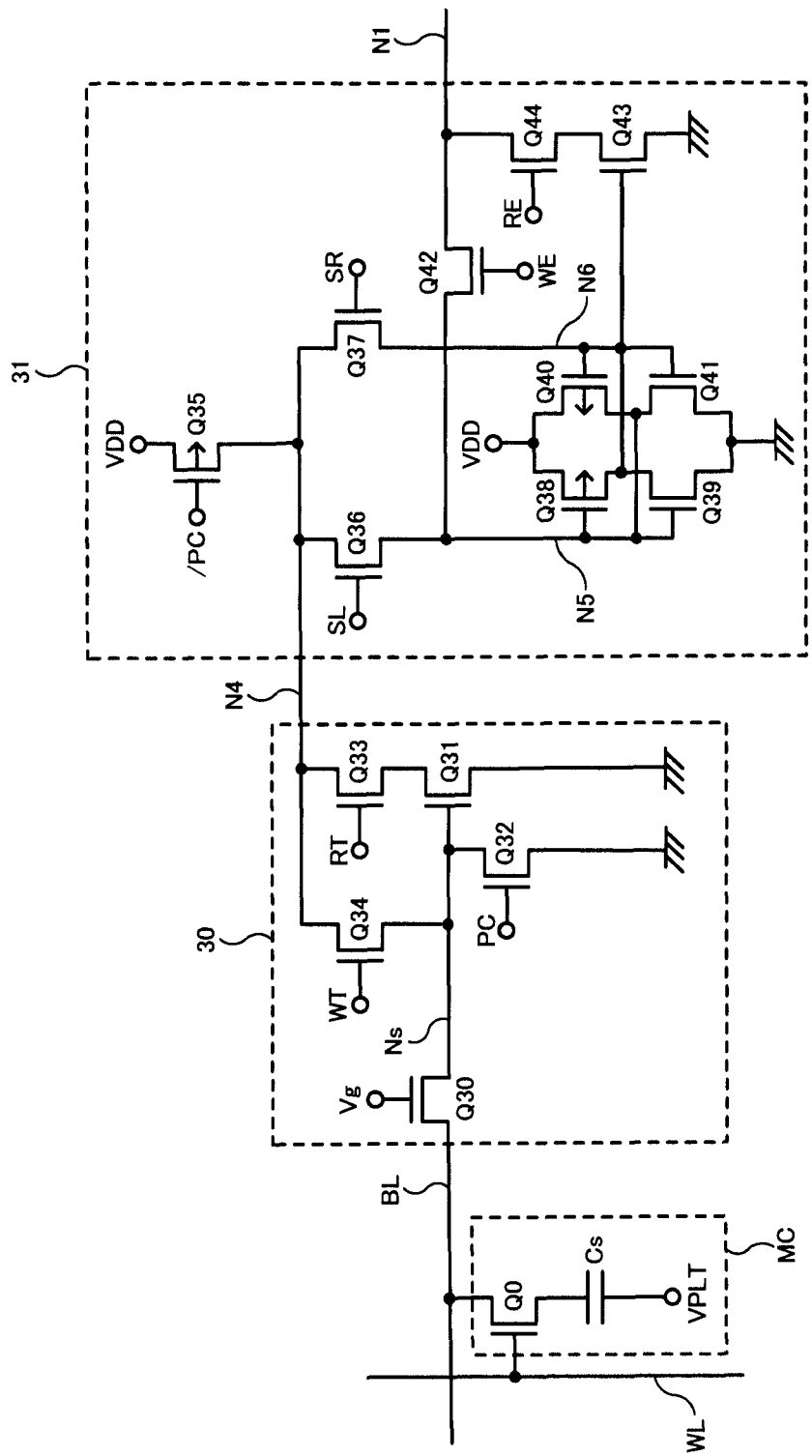
FIG. 5 is a diagram showing an example of a circuit configuration of the sense amplifier and its periphery in the DRAM of the second embodiment.

Here, FIG. 5 shows an example of the circuit configuration of the sense amplifier 20a of FIG. 4 and its periphery. The circuit configuration of FIG. 5 includes a preamplifier 30 and a sense latch circuit 31 which form the single ended sense amplifier 20a, and also includes one memory cell MC arranged corresponding to the sense amplifier 20a. Although FIG. 5 shows one memory cell MC, a plurality of memory cells MC capable of being selectively connected to one bit line BL are practically arranged.

The memory cell MC is composed of an N-channel type select transistor Q0 and a capacitor Cs storing data as charge. The select transistor Q0 has a source connected to the bit line BL and a gate connected to the word line WL. The capacitor Cs is connected between the drain of the select transistor Q0 and a cell plate voltage VPLT.

The preamplifier 30 includes five N-channel type transistors Q30, Q31, Q32, Q33 and Q34. The transistor Q30 functioning as a charge transfer gate is connected between the bit line BL and a sense node Ns in the preamplifier 30, and a control voltage Vg is applied to its gate. The transistor Q31 functioning as an amplifying element is a single ended amplifier and has a gate connected to the sense node Ns. The transistor Q31 senses and amplifies a signal transmitted from the bit line BL via the transistor Q30, and converts the signal into a drain current. This drain current flows from a node N4 between the preamplifier 30 and the sense latch circuit 31 to the ground through the transistors Q33 and Q31. Here, the order of the series connected transistors Q33 and Q31 can be reversed.

A control signal PC is applied to the gate of the transistor Q32 for precharging, and the transistor Q32 precharges the sense node Ns to the ground potential when the control signal PC is at the high level. When the sense node Ns is precharged, the bit line BL is also precharged to the ground potential via the transistor Q30. The transistor Q33 for read control controls connection between the node N4 and the transistor Q31 in response to a control signal RT applied to its gate. The transistor Q34 for write control controls connection between the node N4 and the sense node Ns gate in response to a control signal WT applied to its gate.

The sense latch circuit 31 subsequent to the preamplifier 30 includes three P-channel type transistors Q35, Q38 and Q40 and seven N-channel type transistors Q36, Q37, Q39, Q41, Q42, Q43 and Q44. The transistor Q35 for precharging is connected between a supply voltage VDD and the node N4. The transistor Q35 precharges the node N4 to the supply voltage VDD when an inverted control signal /PC applied to its gate is at the low level. The transistor Q36 controls connection between the node N4 and a node N5 in response to a control signal SL applied to its gate. The transistor Q37 controls connection between the node N4 and a node N6 in response to a control signal SR applied to its gate. In addition, the supply voltage VDD may have a voltage value equal to that of the internal supply voltage VPERI. Further, a transistor for precharging (not shown) is connected between the internal supply voltage VPERI and the output node N1 of the sense amplifier 20a and has a gate to which the inverted control signal /PC is applied.

The transistors Q38, Q39, Q40 and Q41 form a latch, which detects and binarizes a signal voltage transmitted from the preamplifier 30 to the node N4 and latches the signal. A pair of transistors Q38 and Q39 having gates connected to the node N5 forms a sensing inverter having a relatively large driving force, and a pair of transistors Q40 and Q41 having gates connected to the node N6 forms a latching inverter having a relatively small driving force. Each of the two inverters (the sensing and latching inverters) has a circuit configuration in which inputs and outputs are cross-coupled to each other. The transistor Q42 for write operation is connected between the output node N1 and the node N5, and a control signal WE is applied to its gate. Further, the two transistors Q43 and Q44 for read operation are connected in series between the output node N1 and the ground. The gate of the transistor Q43 as the single ended amplifier is connected to the node N6, and a control signal RE is applied to the gate of the transistor Q44. Here, the order of the series connected transistors Q43 and Q44 can be reversed.

Figure 6:
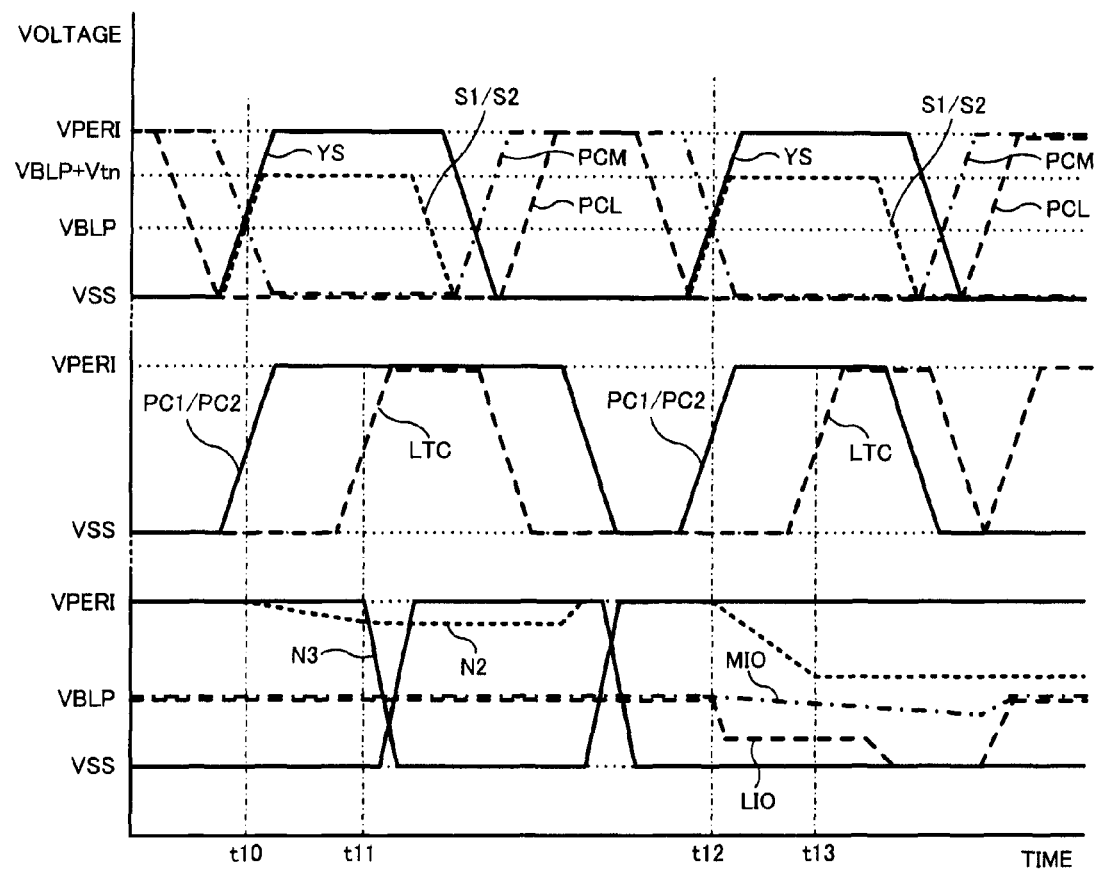
FIG. 6 is a diagram showing operation waveforms of various parts of the read circuit of FIG. 4 corresponding to an operation when low-level data is read out from the sense amplifier first and thereafter high-level data is read out from the sense amplifier.

Next, an operation of the read circuit of FIG. 4 will be described with reference to FIG. 6. FIG. 6 shows operation waveforms of various parts of the read circuit of FIG. 4, which correspond to an operation when low-level data (the second data of the invention) is read out from the sense amplifier 20a first and thereafter high-level data (the first data of the invention) is read out from the sense amplifier 20a. The operation waveforms are represented separately in upper, middle and lower parts of FIG. 6. In FIG. 6, the column select signal YS, the control signals S1/S2 and the control signals PCL/PCM are respectively represented in the upper part, the control signals PC1/PC2 and LTC are represented in the middle part, and the local data line LIO, the main data line MIO and the nodes N2 and N3 are respectively represented in the lower part.

In a first half of the read operation of FIG. 6 reading the low-level data from the memory cell MC, since the control signals PCL/PCM are both at the high level, the local data line LIO and the main data line MIO are both in a state of being precharged to the precharge voltage VBLP. Then, when the read command is inputted, the control signal PCL is changed to the low level and the precharging of the local data line LIO is cancelled. Subsequently, the column select signal YS is changed to the high level at timing t10, and the control signal PCM is changed to the low level. Further, the control signals PC1/PC2 are changed to the high level. At this point, the precharging of the main data line MIO and the nodes N2 and N3 is cancelled, and the control signals S1/S2 are controlled to be the above voltage VBLP+Vtn (the predetermined voltage of the first transistor of the invention). Thus, the low-level data latched in the sense amplifier 20a is read out to the read amplifier 21a sequentially through the output node N1, the local data line LIO, the main data line MIO, the amplifier 22 and the node N3, as described later.

The output node N1 of the sense amplifier 20a is maintained at the high level, the local data line LIO is maintained at the precharge voltage VBLP, and the transistor Q22 does not turn on. Similarly, the main data line MIO is maintained at the precharge voltage VBLP, and the transistor Q24 does not turn on. In addition, since the gate voltage of the transistor Q24 is near the threshold voltage thereof, a slight off current (leak current) actually flows therein. Further, the node N2 of the amplifier 22 at this point is being maintained approximately at the internal supply voltage VPERI (maintaining the second data of the invention). Although the voltage drop of the node N2 due to the off current is exaggerated in FIG. 6, the voltage drop is actually within 0.01V from the internal supply voltage VPERI, and thus the node N2 is substantially maintained at the internal supply voltage VPERI. This is because an activation time (high-level period) of the control signal PC1 in accessing the memory cell MC is short.

Subsequently, when the control signal LTC is changed to the high level at timing t11, charge is drawn from the node N3 through the transistors Q27 and Q26, thereby changing the node N3 from the high level to the low level. Thereby, the latching state of the read amplifier 21a is inverted, and as a result the data RD is inverted. Thereafter, the control signals S1/S2 are returned to the low level, the control signal PCM is returned to the high level, and the control signal LTC is returned to the low level. Further, the column select signal YS is returned to the low level, and the control signal PCL is returned to the high level. By controlling in this manner, the output node N1, the local data line LIO, the main data line MIO and the nodes N2 and N3 are disconnected from one another and shift to the precharge state again, respectively. Thereafter, the control signals PC1/PC2 are returned to the low level, the node N3 changes to the high level so that the read amplifier 21a is reset, and the data RD returns to the former state.

Next, in a second half of the read operation of FIG. 6 reading the high-level data from the memory cell MC, controls for the respective control signals around timing t12 are the same as those in the above read operation of the low level. Meanwhile, the output node N1 of the sense amplifier 20a at this point is shifted to the low level by controlling the control signal RE in the sense amplifier 20a to be the high level. Then, charge is drawn from the local data line LIO to the ground potential (the third voltage of the invention) in the first direction in response to the column select signal YS. Therefore, the potential of the local data line LIO decreases at the timing t12, and the transistor Q22 turns on. Thereby, charge is drawn from the main data line MIO through the transistor Q22, and the potential of the main data line MIO gradually decreases to the low level (the fifth voltage of the invention) in the first direction.

Subsequently, since the potential of the main data line MIO becomes the fifth voltage lower than the precharge voltage VBLP, the transistor Q24 also turns on. Thereby, charge begins to be drawn from the node N2 of the amplifier 22 through the transistor Q24 so that the potential thereof decreases. That is, the charge drawn along a path of the main data line MIO and the local data line LIO is supplied from the node N2 (charge sharing). Therefore, the potential of the main data line MIO changes with a small amplitude (between the precharge voltage VBLP and the fifth voltage), and in contrast the potential of the node N2 having parasitic capacitance much smaller than that of the main data line MIO changes with a large amplitude. As a result, a large voltage difference is obtained in the amplifier 22.

Subsequently, when the control signal LTC is changed to the high level at timing t13, the transistor Q26 is not sufficiently driven because the potential of the node N2 sufficiently decreases at this point, as shown in FIG. 6. As a result, the latching state of the read amplifier 21a is not inverted, and the read operation continues to latch the initial data RD. Subsequent controls for the respective control signals are the same as those in the first half of the read operation of the low level if FIG. 6.

As described above, in the configuration of the second embodiment, in a state of where the read amplifier 21a and the nodes N2 and N3 of the amplifier 22 are previously precharged to the internal supply voltage VPERI and the local data line LIO and the main data line MIO are precharged to the precharge voltage VBLP (VBLP<VPERI), the second switch circuit (transistor Q22) and the third switch circuit (transistor Q24) are controlled to become conductive at the predetermined voltage as the voltage VBLP+Vtn. Therefore, the signal transmitted from the sense amplifier 20a through the respective data lines can be sent to the amplifier 22 in a state of having a small amplitude. That is, in the read operation of the low-level data (the second data of the invention), the potentials of the main data line MIO and the node N2 of the read amplifier 21a can be maintained at the voltage VBLP without fluctuation, and the data of the memory cell MC is indirectly transmitted to the read amplifier circuit. On the other hand, in the read operation of the high-level data (the first data of the invention), the potentials of the main data line MIO and the node N2 of the read amplifier 21a can be enlarged in amplitude, and the data of the memory cell MC is directly transmitted to the read amplifier circuit. In other words, in the read operation of the low-level data, the low-level data of the memory cell MC is indirectly transmitted to the input terminal (node N2) of the read amplifier circuit without being amplified. On the other hand, in the read operation of the high-level data, the high-level data of the memory cell MC is amplified with the small amplitude and is directly transmitted to the input terminal (node N2) of the read amplifier circuit. In the second embodiment, the amplitude for the main data line MIO can be suppressed when a large parasitic capacitance exists, and the effect of reducing operating current can be achieved in the same manner as in the first embodiment. Further, in a single ended configuration employing a charge transfer method, even if the driving force is not enough to directly invert the state of the read amplifier 21a, the voltage difference (voltage difference between the voltage VBLP and the low level as the fifth voltage) which is smaller than that of the conventional configuration is obtained by the charge transfer, and the amplifier 22 can be driven by this voltage difference, so that the state of the read amplifier 21a can be easily inverted.

Third Embodiment

Figure 7:
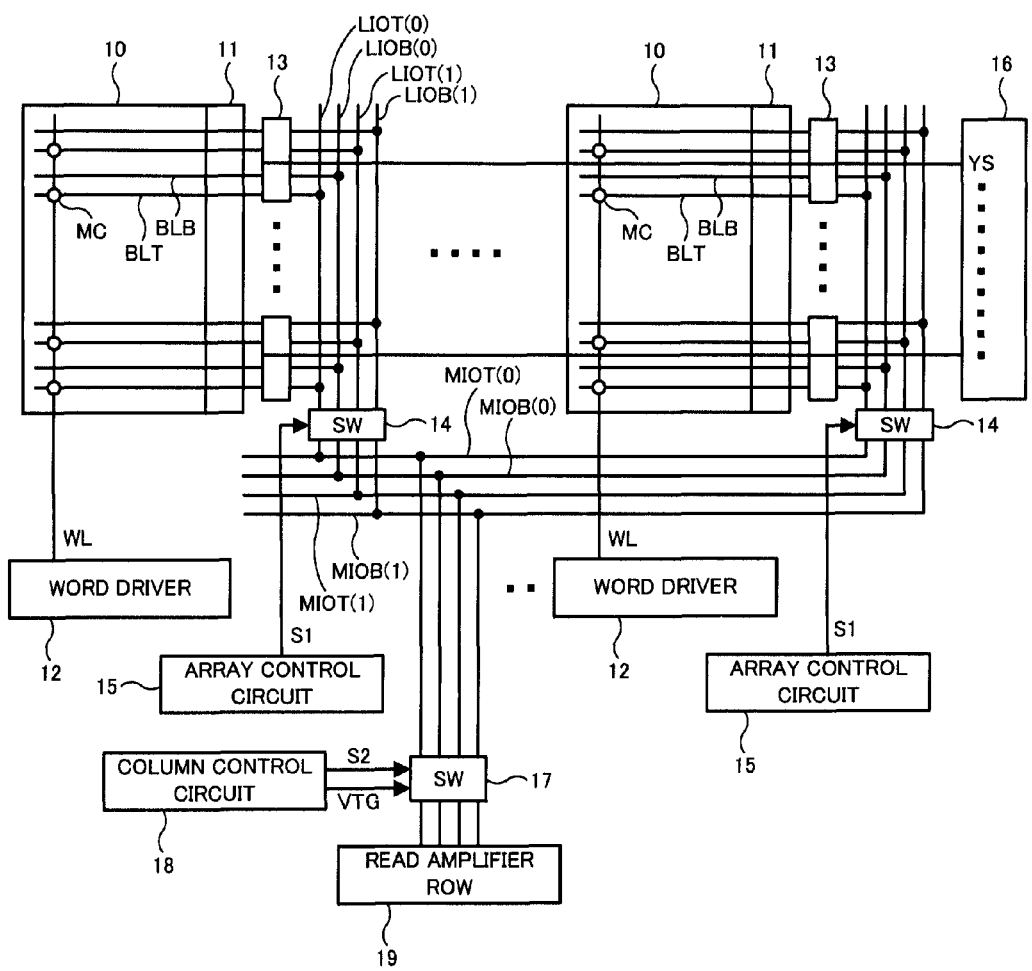
FIG. 7 is a block diagram of an entire configuration of column circuits in a DRAM of a third embodiment.

The third embodiment of the present invention will be described below. FIG. 7 is a block diagram mainly showing an entire configuration of column circuits in a DRAM of the third embodiment. In the block diagram of FIG. 7, most of elements are the same as those in FIG. 1 of the first embodiment, and thus description thereof will be omitted. A difference exists in that the column control circuit 18 of FIG. 7 supplies a control voltage VTG to the switch circuit 17 in addition to the control signal S2 in comparison with FIG. 1, which will be described in detail later.

Figure 8:
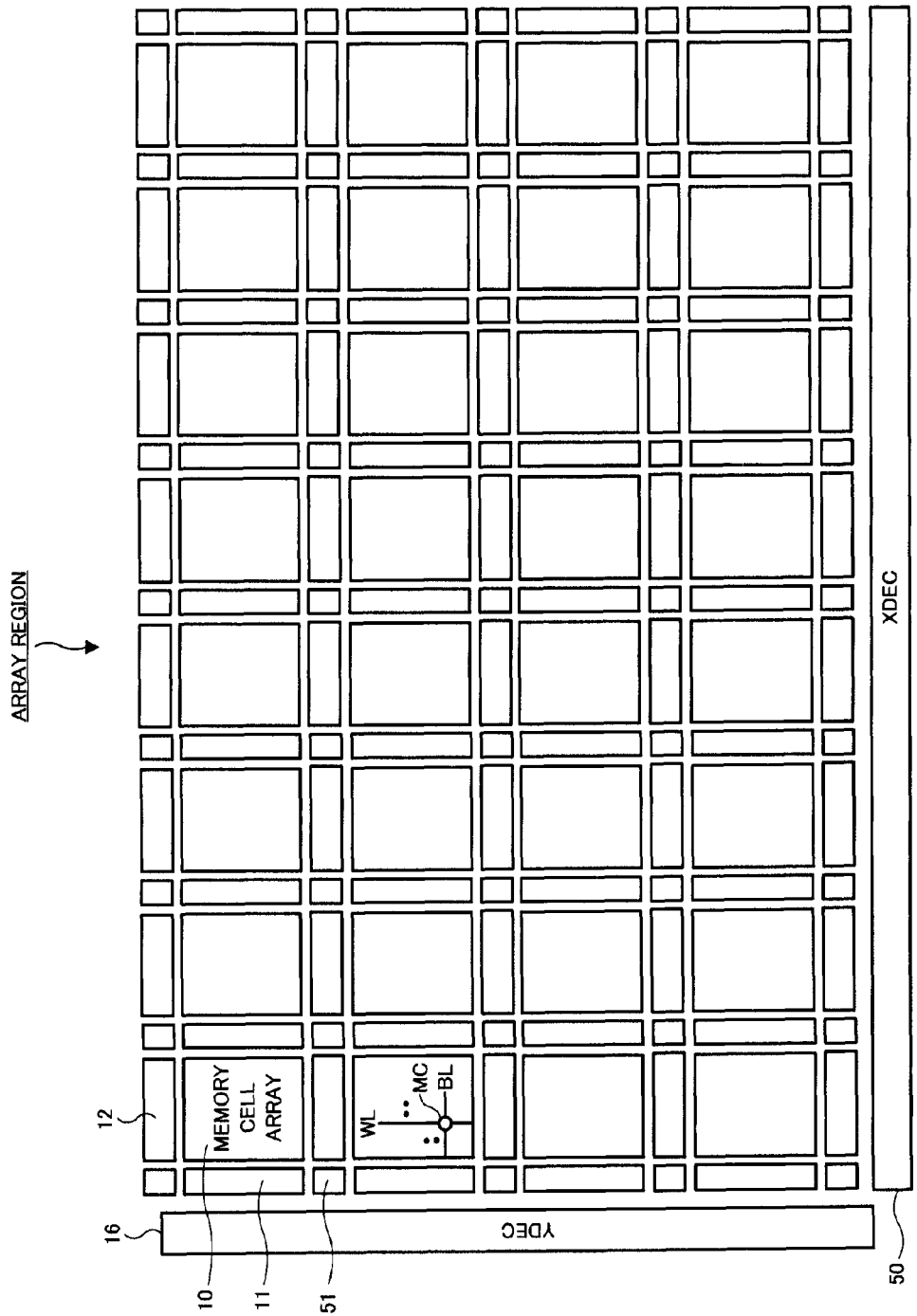
FIG. 8 is a diagram schematically showing an arrangement of an array area including a plurality of memory cell arrays and peripheral circuits thereof in the entire configuration of FIG. 7.

Next, FIG. 8 schematically shows an arrangement of an array area including the plurality of memory cell arrays 10 and peripheral circuits thereof in the entire configuration of FIG. 7. In the array area of FIG. 8, a plurality of sense amplifier rows 11 of FIG. 7 and a plurality of word drivers 12 of FIG. 7 are respectively arranged around each of the memory cell arrays 10. In the example of FIG. 8, 32 (4×8) memory cell arrays 10 are arranged in total in a matrix form. In each of the memory cell arrays 10, the plurality of word lines WL, the plurality of bit lines BL (the bit lines BLT/BLB of FIG. 7) and the plurality of memory cells MC are arranged in the same manner as in FIG. 7.

Further, the plurality of word drivers 12 of FIG. 7 and the plurality of sense amplifier rows 11 of FIG. 7 are arranged around each of the memory cell arrays 10. A plurality of cross areas 51 are arranged in areas where the word drivers 12 and the sense amplifier rows 11 intersects each other. The column decoder 16 (FIG. 7) selecting a bit line BL corresponding to a column address and the row decoder 20 selecting a word line WL corresponding to a row address are arranged in outer peripheral areas of the memory cell arrays 10.

Figure 9:
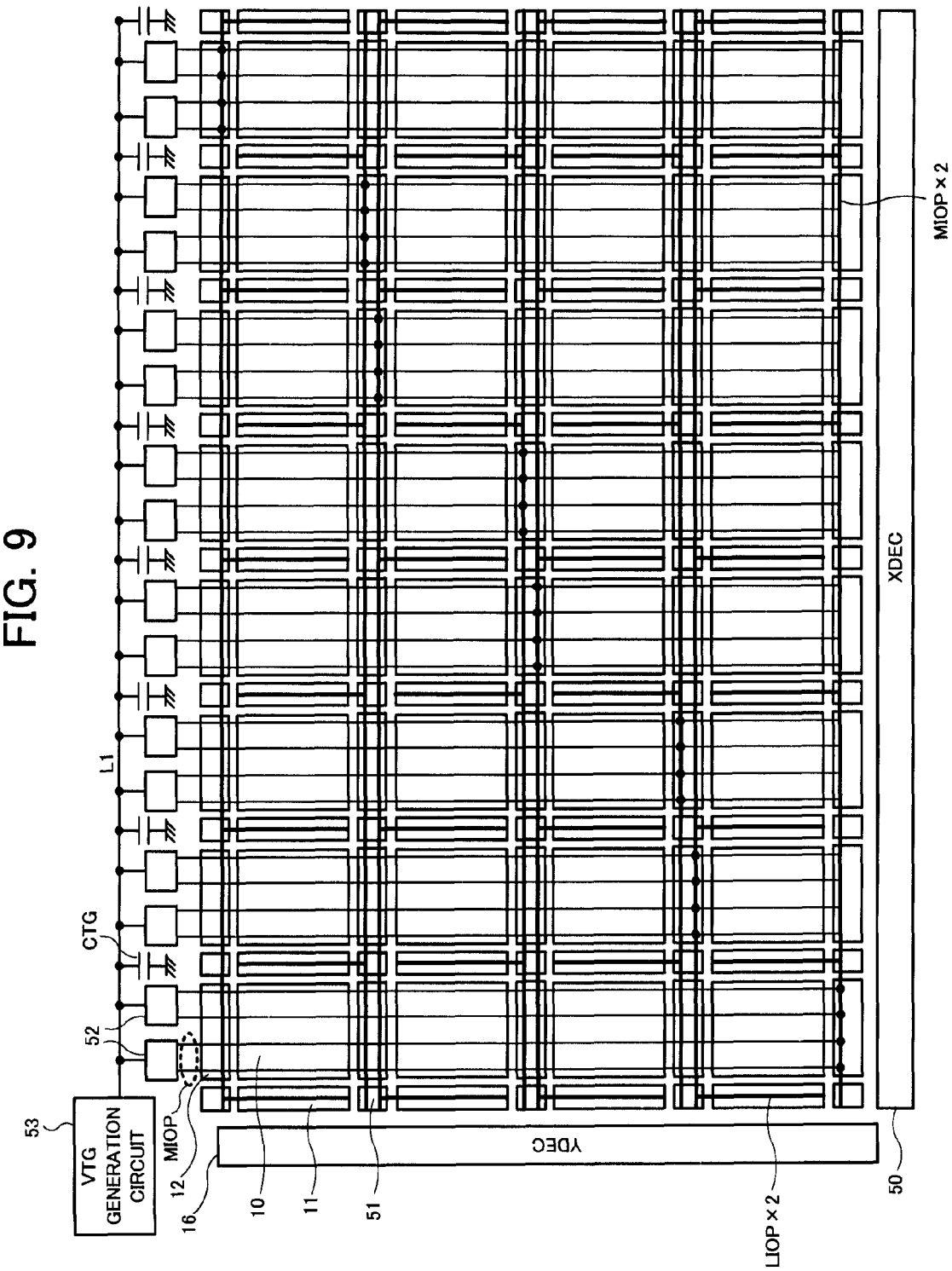
FIG. 9 is a diagram showing lines of local data line pairs and main data line pairs, a plurality of circuits each having a distinctive configuration of the invention, and a VTG generation circuit, which are overlapped with the arrangement of the array area of FIG. 8.

Meanwhile, FIG. 9 shows lines of local data line pairs LIOP (the local data lines LIOT and LIOB of FIG. 7) and main data line pairs MIOP (the main data lines MIOT and MIOB of FIG. 7), a plurality of circuits 52 each having a distinctive configuration of the invention, and a VTG generation circuit 53 (the control voltage generating circuit of the invention) generating a later-described control voltage VTG supplied to the respective circuits 52, which are overlapped with the arrangement of the array area of FIG. 8. FIG. 9 also shows lines L1 connected between the circuits 52 and the VTG generation circuit 53, and a plurality of compensation capacitors CTG formed at the lines L1. In addition, a configuration of a read circuit including each of the circuits 52 of FIG. 9 will be described later (refer to FIG. 10).

As shown in FIG. 9, the local data line pairs LIOP extend over the sense amplifier rows 11, the word drivers 12 and the cross areas 51 with respect to each two pairs. The main data line pairs MIOP extend over four memory cell arrays 10 and five word drivers 12 that are aligned in a direction of the word lines WL with respect to each two pairs. Each of the main data line pairs MIOP is connected a predetermined local data line pair LIOP in one of four word drivers 12 that exist in the direction of the word lines WL. Further, one ends of each of the main data line pairs MIOP are connected to one circuit 52. Thus, 16 circuits 52 corresponding to 16 main data line pairs MIOP are aligned in the direction of the bit lines BL. The lines L1 extending from the VTG generation circuit 53 are respectively connected to each of the 16 circuits 52. The plurality of compensation capacitors CTG formed at predetermined positions of the lines L1 serve to suppress later-described gate coupling in the circuits 52. Further, the lines L1 have parasitic resistances (not shown). The control voltage VTG generated by the VTG generation circuit 53 is controlled to be a predetermined fixed voltage, which will be described in detail later.

FIG. 10 shows a specific circuit configuration of a portion of the read circuit in the DRAM of the third embodiment. The circuit configuration of FIG. 10 includes the sense amplifier 20, the pair of local data lines LIOT/LIOB and the pair of main data lines MIOT/MIOB, the transistors Q10 to Q19, Q100, Q101, the compensation capacitor CTG, and the read amplifier 21. In FIG. 10, most of elements are the same as those in FIG. 2 of the first embodiment, and thus description thereof will be omitted. A difference exists in that the transistors Q100, Q101 and the compensation capacitor CTG are further provided in FIG. 10 in addition to the configuration of FIG. 2, which will be described in detail later.

A pair of N-channel type transistors Q100 and Q101 (the charge transfer transistors of the invention) is included in the switch circuit 17 of FIG. 7. One transistor Q100 has a source (one terminal) and a drain (the other terminal) connected between the transistor Q18 and one node RAB of the read amplifier 21. The other transistor Q101 has a source (one terminal) and a drain (the other terminal) connected between the transistor Q19 and the other node RAT of the read amplifier 21. The control voltage VTG is applied to gates of both the transistors Q100 and Q101. That is, transistors Q18 and Q100 are connected in series between the main data line MIOB and the node RAB via an intermediate node (the first node of the invention) of the transistors Q18 and Q100, and transistors Q19 and Q101 are connected in series between the main data line MIOT and the node RAT via an intermediate node (the first node of the invention) of the transistors Q19 and Q101.

The control voltage VTG applied to the gates of the transistors Q100 and Q101 is set to a DC fixed voltage obtained by adding a threshold voltage Vtn of an N-channel type transistor to the precharge voltage VBLP. Further, the compensation capacitor CTG is connected between a ground potential VSS and the gates of the transistors Q100 and Q101, and is set to a value such that the gate coupling between the gates of the transistors Q100, Q101 and the nodes RAB, RAT of the read amplifier 21 can be suppressed. Here, the pair of main data lines MIOT and MIOB are connected to the pair of nodes RAT and RAB when the control signal S2 and the control voltage VTG are both at a high level.

Figure 11:
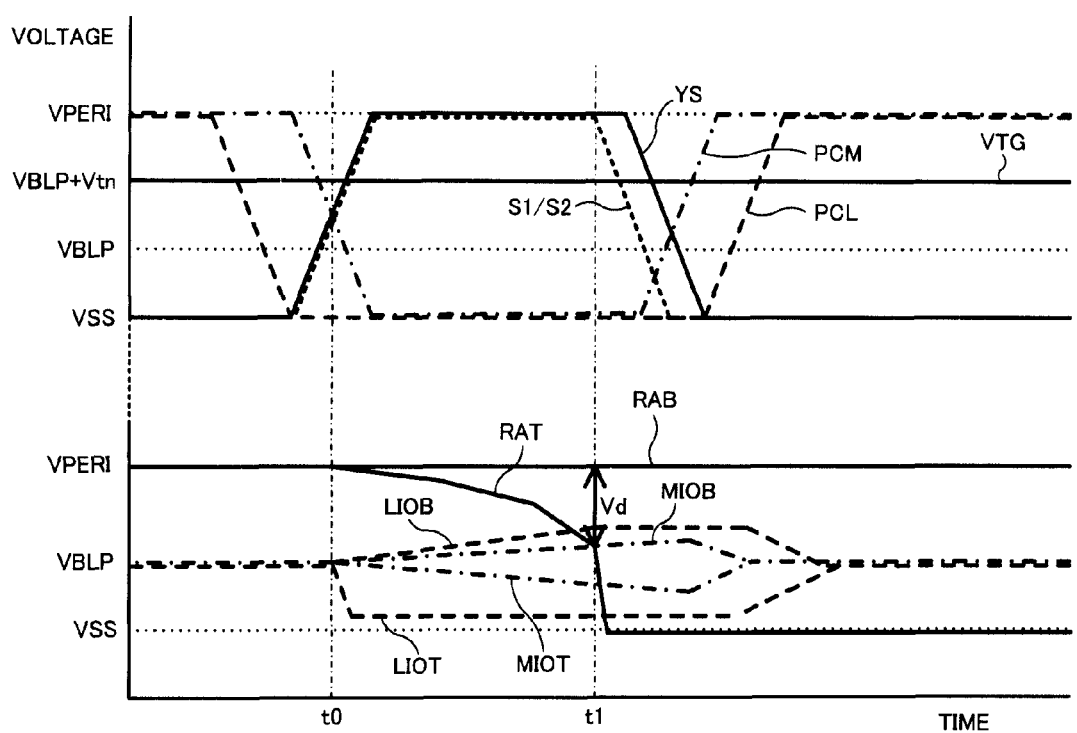
FIG. 11 is a diagram showing operation waveforms of various parts of the read circuit of FIG. 10 corresponding to an operation to read low-level data from the sense amplifier.

Next, an operation of the read circuit of FIG. 10 will be described with reference to FIG. 11. FIG. 11 shows operation waveforms of various parts of the read circuit of FIG. 10, which correspond to an operation when low-level data is read out from the sense amplifier 20. The operation waveforms of FIG. 11 are represented in the same manner as those of FIG. 3. Besides, the high level of at least one of the control signals S1 and S2 can be set to the AC voltage VBLP+Vtn (the predetermined voltage of the invention), which will be described in detail later.

In an initial period of FIG. 11, states of the control signals PCL/PCM, the local data lines LIOT/LIOB, the bit lines BLT/BLB and the output nodes SAT/SAB are the same as those in FIG. 3. Further, the control voltage VTG is fixed to the voltage VBLP+Vtn obtained by adding the threshold voltage Vtn to the precharge voltage VBLP, as described above.

Then, when the read command is inputted, the control signal PCL is changed to the low level and the precharging of the local data lines LIOT/LIOB is cancelled. Subsequently, the column select signal YS is changed to the high level at the timing to, and the control signal PCM is changed to the low level. At this point, the precharging of the main data lines MIOT/MIOB is cancelled, and the control signals S1/S2 are controlled to be the high-level (the internal supply voltage VPERI). On the other hand, the control voltage VTG is fixed to the voltage VBLP+Vtn at this time, as described above. Thus, the read operation of the low-level data latched in the sense amplifier 20 is started, and the read data is transferred to the read amplifier 21 sequentially through the output nodes SAT/SAB, the local data lines LIOT/LIOB, the main data lines MIOT/MIOB and the nodes RAT/RAB, as described later.

At the timing t0, the potential of the local data line LIOT is changed from the precharge voltage VBLP to the low level in the read operation of the low-level data from the sense amplifier 20, and the potential of the main data line MIOT is gradually lowered to the low level via the transistor Q15. This is because a load of parasitic capacitance of each main data line MIOT is larger than a load of parasitic capacitance of each local data line LIOT. Meanwhile, the output node SAB of the sense amplifier 20 becomes the high level whose polarity is reverse to that of the output node SAT, and the potential of the local data line LIOB gradually rises to the high level via the transistor Q10. Thereby, the potential of the main data line MIOB gradually rises to a level slightly higher than the precharge voltage VBLP. This is because the load of parasitic capacitance of each main data line MIOT is larger than the load of parasitic capacitance of each local data line LIOT. In addition, a temporal changing rate of the potentials is affected by the magnitude of parasitic capacitances and values of ON-resistance of the transistors.

Since the potential of the main data line MIOT becomes lower than the precharge voltage VBPL, the transistor Q101 turns on so that charge begins to be drawn from the node RAT of the read amplifier 21. That is, the charge drawn along a path of the main data line MIOT and the local data line LIOT is supplied from the node RAT (charge sharing). Therefore, the potential of the main data line MIOT changes with a small amplitude, and in contrast the potential of the node RAT having the parasitic capacitance much smaller than that of the main data line MIOT changes with a large amplitude. As a result, the large voltage difference (Vd) appears between the pair of nodes RAT/RAB with a higher speed than that of the voltage difference between the pair of main data lines MIOT and MIOB. In other words, a slew rate (voltage transition amount) per a predetermined time of the node RAT is larger than a slew rate of the main data line MIOT. Thus, the read amplifier 21 outputs the data of the memory cell MC with a stable operation and a high speed. As shown in FIG. 11, since the required voltage difference Vd is obtained between the pair of nodes RAT/RAB at the timing t1, a signal corresponding to the voltage difference Vd is latched by activating the read amplifier 21.

The control signals S1/S2 are changed from the high level (the internal supply voltage VPERI) to the low level (the ground voltage VSS) at the timing t1. Subsequently, when the column select signal YS is changed from the high level to the low level, the control signal PCM is changed from the low level to the high level. Thereafter, the control signal PCL is also changed from the low level to the high level. By controlling in this manner, the output nodes SAT/SAB of the sense amplifier 20, the local data lines LIOT/LIOB, the main data lines MIOT/MIOB, and the nodes RAT/RAB of the read amplifier 21 are disconnected from one another and shift to the precharge state again, respectively.

Regarding an operation for a case where high-level data is read out from the sense amplifier 20, respective behaviors of the bit lines BLT/BLB, the local data lines LIOT/LIOB and the main data lines MIOT/MIOB may be reverse to those in the case of FIG. 11.

As described above, in the configuration of the third embodiment, in addition to the effects of the first embodiment, following effects can be further obtained. That is, the high level of the control signal S1 may be changed from the internal supply voltage VPERI to the voltage VBLP+Vtn (the predetermined voltage of the invention) in an AC manner. For example, the predetermined voltage is 0.6 v when the precharge voltage VBLP is 0.5 v and the threshold voltage Vtn is 0.1 v. In conjunction with the read operation of the low-level data from the sense amplifier 20, the output node SAB of the sense amplifier 20 becomes the high level whose polarity is reverse to that of the output node SAT, and the potential of the local data line LIOB gradually rises to the high level via the MOS transistor Q10. Therefore, the MOS the transistor Q14 is not turned on, and the main data line MIOB is maintained at a state of the precharge voltage VBLP.

Further, the high level of the control signal S2 may be changed from the internal supply voltage VPERI to the voltage VBLP+Vtn in the AC manner. The high level of the control signal S1 and the high level of the control signal S2 can be independently set, respectively.

In the third embodiment, the read operation of the low-level data of the memory cell MC is performed so that the potential of the main data line MIOB transmitting the inverted data and the potential of the node RAB of the read amplifier 21 are maintained at the voltage VBLP without fluctuation, and the data of the memory cell MC is indirectly transmitted to the read amplifier 21. On the other hand, the potential of the main data line MIOT transmitting the in-phase data and the potential of the node RAT of the read amplifier 21 are enlarged in amplitude, and the data of the memory cell MC is directly transmitted to the read amplifier 21. In other words, the high-level data of the memory cell MC is indirectly transmitted to the input terminal (node RAT) of the read amplifier 21 without being amplified. On the other hand, the low-level data of the memory cell MC is amplified with the small amplitude and is directly transmitted to the input terminal of the read amplifier 21. In this case, the amplitude for the main data lines MIOT/MIOB, which is generally regarded to have a large parasitic capacitance, can be reduced to at least half that of the conventional configuration, thereby achieving a great effect of reducing operating current.

Meanwhile, in the read operation of the low-level data of the memory cell MC, after the data is transmitted to the local data line LIOB and the main data line MIOB, the data is further transmitted to the node RAB as the input node of the amplifier 22 via the series connected transistors Q18 and Q100. At this point, in the charge transfer operation of the transistor Q100 as the charge transfer transistor, the gate potential thereof is set to the voltage VBLP+Vtn as described above, and the compensation capacitor CTG is connected to the gate terminal. Therefore, it is possible to reliably suppress the gate coupling in the transistor Q100 when the potential of the node RAB falls to the low level. In addition, in the read operation of the high-level data of the memory cell MC, since a difference between the potential of the main data line MIOP and the gate potential of the transistor Q100 is only the threshold voltage Vtn, it is possible to suppress the off current of the transistor Q100 and to prevent a decrease in operating margin of the read amplifier 21 due to the voltage decrease of the node RAB. Further, an effect of decreasing the operating current can be obtained by setting the high level of at least one of the control signals S1 and S2 to the above predetermined voltage.

Fourth Embodiment

The fourth embodiment of the present invention will be described below. The fourth embodiment employs the single ended configuration similarly as in the second embodiment. In the fourth embodiment, the elements of the block diagram of FIGS. 7 to 9 in the third embodiment are common if circuit portions corresponding to the bit lines BL, the local data lines LIO and the main data lines MIO are replaced with single ended circuit configurations, so description thereof will be omitted.

Figure 12:
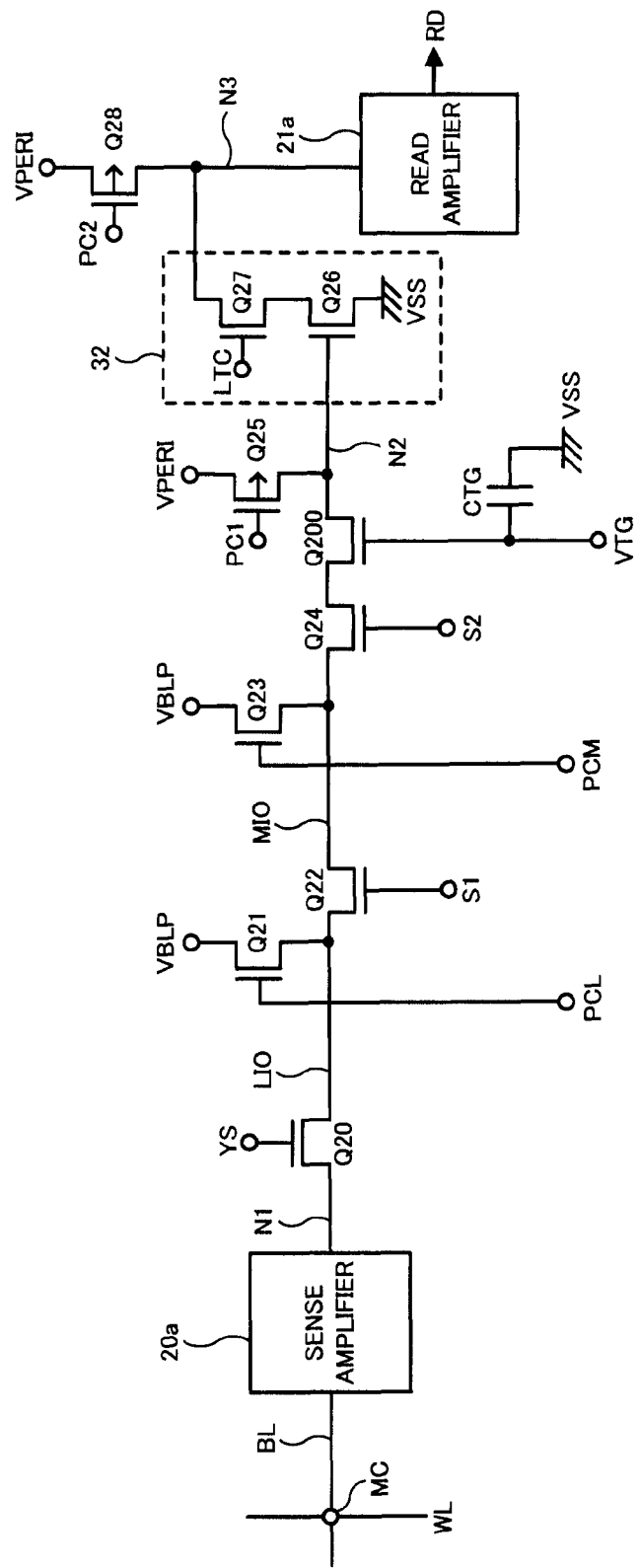
FIG. 12 is a diagram showing a specific circuit configuration of a portion of the read circuit in the DRAM of a fourth embodiment.

FIG. 12 shows a specific circuit configuration of a portion of the read circuit in the DRAM of the fourth embodiment. The circuit configuration of FIG. 12 corresponds to the same range in FIG. 10 of the third embodiment, which includes one sense amplifier 20a, one local data line LIO (the first data line of the invention), one main data line MIO (the second data line of the invention), circuit portions corresponding to the switch circuits 14, 17, one amplifier 22, and one read amplifier 21a, and ten transistors Q20 to Q28 and Q200 in total are provided therein. In FIG. 12, most of elements are the same as those in FIG. 6 of the second embodiment, and thus description thereof will be omitted. A difference exists in that the transistor Q200 and the compensation capacitor CTG are further provided in FIG. 12 in addition to the configuration of FIG. 6, which will be described in detail later.

The N-channel type transistor Q200 (the charge transfer transistor of the invention) controls a connection between the transistor Q24 and the node N2 of the amplifier 22 in response to the control voltage VTG applied to its gate. Here, the control voltage VTG applied to the gate of the transistor Q200, and the compensation capacitor CTG connected between the gate of the transistor Q200 and the ground potential VSS are the same as those in the third embodiment (FIG. 10).

Figure 13:
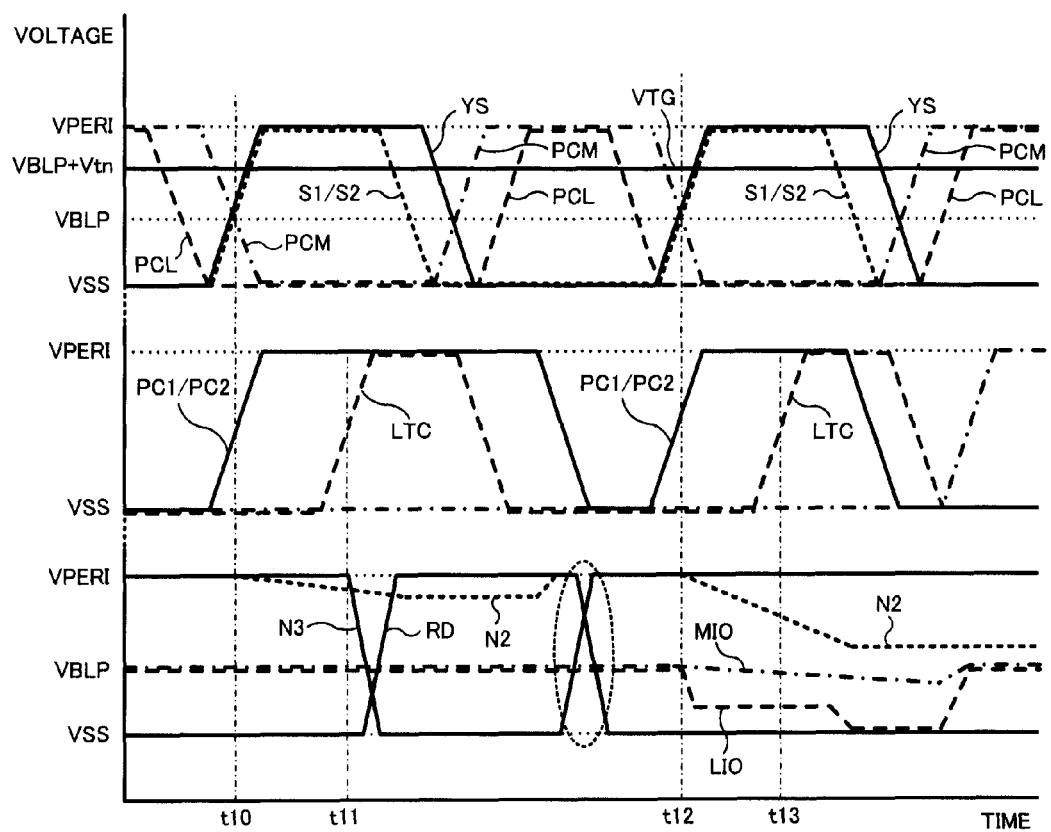
FIG. 13 is a diagram showing operation waveforms of various parts of the read circuit of FIG. 12 corresponding to an operation to read data from the sense amplifier.

Next, an operation of the read circuit of FIG. 12 will be described with reference to FIG. 13. FIG. 13 shows operation waveforms of various parts of the read circuit of FIG. 12, which correspond to an operation when low-level data is readout from the sense amplifier 20a first and thereafter high-level data is read out from the sense amplifier 20a. The operation waveforms of FIG. 12 are represented in the same manner as those of FIG. 6.

In a first half of the read operation of FIG. 13 reading the low-level data from the memory cell MC, since the control signals PCL/PCM are both at the high level, the local data line LIO and the main data line MIO are both in a state of being precharged to the precharge voltage VBLP. Then, when the read command is inputted, the control signal PCL is changed to the low level and the precharging of the local data line LIO is cancelled. Subsequently, the column select signal YS is changed to the high level at the timing t10, and the control signal PCM is changed to the low level. Further, the control signals PC1/PC2 are changed to the high level. At this point, the precharging of the main data line MIO and the nodes N2 and N3 is cancelled, and the control signals S1/S2 are controlled to be the high-level (the internal supply voltage VPERI). Thus, the read operation of the data latched in the sense amplifier 20a is started, and the read data is transferred to the read amplifier 21a sequentially through the output node N1, the local data line LIO, the main data line MIO, the node N2, the amplifier 22 and the node N3, as described later.

At this time, the node N6 (FIG. 5) in the sense amplifier 20a is at the low level and the local data line LIO is maintained at the precharge voltage VBLP. Therefore, the main data line MIO is maintained at the precharge voltage VBLP even if the transistor Q22 turns on, and the transistor Q200 does not turn on even if the transistor Q24 turns on. In addition, since the gate voltage of the transistor Q200 is near the threshold voltage thereof, a slight off current (leak current) actually flows therein. Further, the node N2 of the amplifier 22 at this point is being maintained approximately at the internal supply voltage VPERI. In FIG. 13, the voltage drop of the node N2 due to the off current is exaggerated similarly as FIG. 6.

Subsequently, when the control signal LTC is changed to the high level at the timing t11, charge is drawn from the node N3 through the transistors Q27 and Q26, thereby changing the node N3 from the high level to the low level. Thereby, the latching state of the read amplifier 21a is inverted, and as a result the data RD is inverted. Thereafter, the control signals S1/S2 are returned to the low level, the control signal PCM is returned to the high level, and the control signal LTC is returned to the low level. Further, the column select signal YS is returned to the low level, and the control signal PCL is returned to the high level. By controlling in this manner, the output node N1, the local data line LIO, the main data line MIO and the nodes N2 and N3 are disconnected from one another and shift to the precharge state again, respectively. Thereafter, the control signals PC1/PC2 are returned to the low level, the node N3 changes to the high level so that the read amplifier 21a is reset, and the data RD returns to the former state.

Next, in a second half of the read operation of FIG. 13 reading the high-level data from the memory cell MC, controls for the respective control signals around the timing t12 are the same as those in the above read operation of the low-level data. Meanwhile, the output node N1 of the sense amplifier 20a at this point is shifted to the low level by controlling the control signal RE (FIG. 5) to be the high level.

Then, charge is drawn from the local data line LIO to the ground potential VSS in response to the column select signal YS. Therefore, the potential of the local data line LIO decreases at the timing t12, and charge is drawn from the main data line MIO through the transistor Q22, and the potential of the main data line MIO gradually decreases to the low level.

Subsequently, since the potential of the main data line MIO becomes lower than the precharge voltage VBLP, and charge begins to be drawn from the node N2 of the amplifier 22 through the transistor Q24 so that the potential thereof decreases. That is, the charge drawn along a path of the main data line MIO and the local data line LIO is supplied from the node N2 (charge sharing). Therefore, the potential of the main data line MIO changes with a small amplitude, and in contrast the potential of the node N2 having the parasitic capacitance much smaller than that of the main data line MIO changes with a large amplitude and with a higher speed than the potential transition of the main data line MIO. As a result, the amplifier 22 outputs the data of the memory cell MC with a stable operation and a high speed. In other words, a slew rate per a predetermined time of the node N2 is larger than a slew rate of the main data line MIOT.

Subsequently, when the control signal LTC is changed to the high level at the timing t13, the transistor Q26 is not sufficiently driven because the potential of the node N2 sufficiently decreases at this point, as shown in FIG. 13. As a result, the latching state of the read amplifier 21a is not inverted, and the read data RD of the initial read operation continues to be latched. Subsequent controls for the respective control signals are the same as those in the first half of the read operation of the low-level data in FIG. 13.

As described above, in the configuration of the fourth embodiment, in addition to the effects of the second embodiment, following effects can be further obtained. Besides, similarly as in the third embodiment, the high level of at least one of the control signals S1 and S2 can be set to the AC voltage VBLP+Vtn (the predetermined voltage of the invention), in which the same effect of the third embodiment can be obtained.

That is, in the read operation of the data of the memory cell MC, after the data is transmitted to the local data line LIO and the main data line MIO, the data is further transmitted to the node N2 as the input node of the amplifier 22 subsequent to the read amplifier 21a via the series connected transistors Q24 and Q200. In this case, when performing the read operation of the high-level data of the memory cell MC, a decrease in operating margin can be prevented by suppressing the off current of the transistor Q200, similarly as in the third embodiment. Further, when performing the read operation of the low-level data of the memory cell MC, the fixed voltage VBLP+Vtn applied to the gate of the transistor Q200 and the compensation capacitor CTG operate to reliably suppress the gate coupling in the transistor Q200 when the potential of the node N2 falls to the low level.

[Data Processing System]

Figure 14:
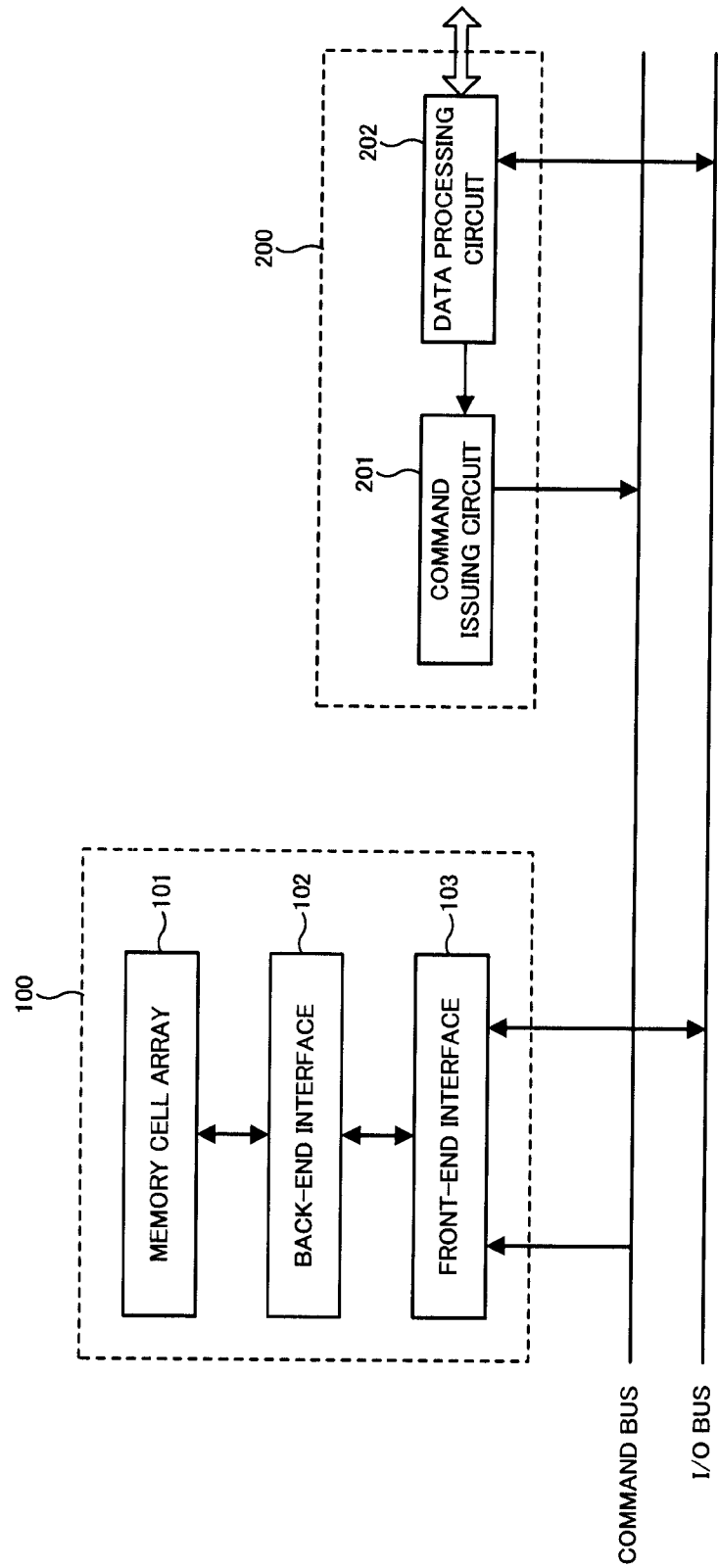
FIG. 14 is a diagram showing a configuration example of a data processing system including a semiconductor device having the configuration described in the embodiments and a controller controlling operation of the semiconductor device.

Next, a case in which the present invention is applied to a system including a semiconductor device will be described. FIG. 14 shows a configuration example of a data processing system including a semiconductor device 100 having the configuration described in the embodiments and a controller 200 controlling operation of the semiconductor device 100.

The semiconductor device 100 is provided with a memory cell array 101, a back-end interface 102 and a front-end interface 103. In the memory cell array 101, a predetermined number of memory cell arrays 10 each including a large number of memory cells MC of the embodiments are arranged. The back-end interface 102 includes peripheral circuits around the memory cell arrays 10 of FIG. 1, the local data lines LIOT/LIOB and the global data lines MIOT/MIOB. The front-end interface 103 has a function to communicate with the controller 200 through a command bus and an I/O bus. Although FIG. 14 shows one semiconductor device 100, a plurality of semiconductor devices 100 can be provided in the system.

The controller 200 is provided with a command issuing circuit 201 and a data processing circuit 202, and controls operation of the system as a whole and the operation of the semiconductor device 100. The controller 200 is connected with the command bus and the I/O bus, and additionally has an interface for external connection. The command issuing circuit 201 sends commands to the semiconductor device 100 through the command bus. The data processing circuit 202 sends and receives data to and from the semiconductor device 100 through the data bus and performs processes required for the controlling. In addition, the semiconductor device of the embodiments may be included in the controller 200 in FIG. 14.

The data processing system of FIG. 14 is, for example, a system implemented in electronics devices such as personal computers, communication electronics devices, mobile electronics devices and other industrial/consumer electronics devices.

In the foregoing, the preferred embodiments of the present invention have been described. However the present invention is not limited to the above embodiments and can variously be modified without departing the essentials of the present invention, and the present invention obviously covers the various modifications. That is, the present invention covers the various modifications which those skilled in the art can carry out in accordance with all disclosures including claims and technical ideas.

For example, a sense latch circuit 31 in the fourth embodiment can be removed. In this case, the node N1 and the node N4 should be the same node.

Further, although the configuration of the DRAM as the semiconductor device provided with hierarchical data lines has been described in the embodiments, the present invention is not limited to the DRAM and can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like, all of which includes a memory unit. The memory unit may be a volatile memory or a non-volatile memory.

Further, the present invention can be applied to various devices such as SOC (System on Chip), MCP (Multi Chip Package) and POP (Package on Package) and the like. Various cell structures can be employed for the select transistor Q0 of the memory cell MC. A vertical transistor can be employed for the structure of the select transistor Q0 and other transistors in the semiconductor device.

Further, FETs (Field Effect Transistors) can be used for the transistors (the first transistor of the invention) in the embodiments. Also various FETs other than MOS (Metal Oxide Semiconductor) transistors can be used, which includes, for example, MIS (Metal-Insulator Semiconductor), TFT (Thin Film Transistor). Transistors other than FETs can be used for other transistors, which may include bipolar transistors. Further, an N-channel type transistors (NMOS transistors) is a typical example of a first conductive type transistor, and a P-channel type transistor (PMOS transistor) is a typical example of a second conductive type transistor. Furthermore, an N-TYPE semiconductor substrate can be used other than a P-type semiconductor substrate, and also a semiconductor substrate having SOI (Silicon on Insulator) structure or other type semiconductor substrates can be used.

Further, various circuit configurations can be employed for the sense amplifier 20, the read amplifier 21, the respective switch circuits, and the respective voltage setting circuits, without being limited to the circuit configurations described in the embodiments.

The invention claimed is:

1. A semiconductor device capable of selectively reading and transmitting data stored in a plurality of memory cells through a bit line, the semiconductor device comprising:
   a sense amplifier circuit amplifying a signal transmitted through the bit line;
   a first data line transmitting the signal amplified by the sense amplifier circuit;
   a second data line transmitting the signal transmitted through the first data line;
   a read amplifier circuit driven by a first voltage, the read amplifier amplifying the signal transmitted through the second data line;
   a first switch circuit controlling an electrical connection between an output node of the sense amplifier circuit and a one end of the first data line;
   a second switch circuit controlling an electrical connection between an other end of the first data line and a one end of the second data line;
   a third switch circuit controlling an electrical connection between an other end of the second data line and a first node;
   a charge transfer transistor controlling a charge transfer between the first node and an input node of the read amplifier circuit in response to a control voltage applied to a gate terminal;
   a first voltage setting circuit setting the first data line to a second voltage lower than the first voltage;
   a second voltage setting circuit setting the second data line to the second voltage;
   a control voltage generating circuit generating the control voltage having a fixed voltage obtained by adding the second voltage to a threshold voltage of the charge transfer transistor; and
   a compensation capacitor formed at a line that supplies a the control voltage from the control voltage generating circuit to the charge transfer transistor,
   wherein each of the second and third switch circuits includes a first transistor having a gate terminal, a source terminal and a drain terminal,
   and a signal having a high-level voltage of a predetermined voltage is applied to the gate terminal of the first transistor, the predetermined voltage being the first voltage or being obtained by adding the second voltage to a threshold voltage of the first transistor.

2. The semiconductor device according to claim 1, wherein a voltage transition amount per a predetermined time of the input node of the read amplifier circuit is larger than a voltage transition amount per the predetermined time of the second data line, in association with reading of the data.

3. The semiconductor device according to claim 1, wherein when the predetermined voltage is applied to the gate terminal of the first transistor of the second switch circuit, a voltage amplitude of the second data line is smaller than a voltage amplitude of the first data line.

4. The semiconductor device according to claim 3, wherein a voltage amplitude of the input node of the read amplifier circuit is larger than a voltage amplitude of the second data line, in association with reading of the data.

5. The semiconductor device according to claim 1,
   wherein the sense amplifier circuit has a differential configuration amplifying a voltage difference between a pair of bit lines as a complementary pair,
   each of the first and second data lines is composed of a pair of data lines corresponding to the pair of bit lines,
   and the read amplifier circuit has a differential configuration amplifying a voltage difference between a pair of input nodes corresponding to the pair of data lines.

6. The semiconductor device according to claim 5,
   wherein the first switch circuit is a pair of transistors each having the gate terminal to which a first control signal is applied,
   the second switch circuit is a pair of transistors each having the gate terminal to which a second control signal is applied,
   and the third switch circuit is a pair of transistors each having the gate terminal to which a third control signal is applied.

7. The semiconductor device according to claim 6,
   wherein the pair of the transistors of the first switch circuit becomes conductive when the first control signal is controlled to be equal to or larger than the first voltage,
   the pair of transistors of the second switch circuit becomes conductive when the second control signal is controlled to be the first voltage or the predetermined voltage,
   and the pair of transistors of the third switch circuit becomes conductive when the third control signal is controlled to be the first voltage or the predetermined voltage.

8. The semiconductor device according to claim 1, wherein each of the first and second voltage setting circuits includes a pair of transistors each having a source terminal to which the second voltage is applied, and each of drain terminals of the pair of transistors is connected to a line of each of the pair of data lines.

9. The semiconductor device according to claim 8,
   wherein the first voltage setting circuit includes a pair of transistors each having a conductivity controlled in response to a fourth control signal applied to a gate terminal thereof,
   and the second voltage setting circuit includes a pair of transistors each having a conductivity controlled in response to a fifth control signal applied to a gate terminal thereof.

10. The semiconductor device according to claim 1, wherein the second voltage is set to an intermediate voltage between the first voltage and a ground potential.

11. The semiconductor device according to claim 1,
    wherein the sense amplifier circuit has a single ended configuration amplifying a signal voltage transmitted through one bit line, the sense amplifier having an input node connected to the bit line and an output node connected to the first data line,
    each of the first and second data lines is one data line corresponding to the one bit line,
    and the read amplifier circuit has a single ended configuration amplifying a signal voltage transmitted through the one data line of the second data line.

12. The semiconductor device according to claim 11,
    wherein the first switch circuit is one transistor having the gate terminal to which a first control signal is applied,
    the second switch circuit is one transistor having the gate terminal to which a second control signal is applied,
    and the third switch circuit is one transistor having the gate terminal to which a third control signal is applied.

13. The semiconductor device according to claim 12,
wherein the one transistor of the first switch circuit becomes conductive when the first control signal is controlled to be equal to or larger than the first voltage,
the one transistor of the second switch circuit becomes conductive when the second control signal is controlled to be the first voltage or the predetermined voltage,
and the first transistor of the third switch circuit becomes conductive when the third control signal is controlled to be the first voltage or the predetermined voltage.

14. A data processing system comprising:
a semiconductor device; and
a controller connected to the semiconductor device through a bus, the controller controlling an operation of the semiconductor device,
the semiconductor device being capable of selectively reading and transmitting data stored in a plurality of memory cells through a bit line,
and the semiconductor device comprising:
a sense amplifier circuit amplifying a signal transmitted through the bit line;
a first data line transmitting the signal amplified by the sense amplifier circuit;
a second data line transmitting the signal transmitted through the first data line;
a read amplifier circuit driven by a first voltage, the read amplifier amplifying the signal transmitted through the second data line;
a first switch circuit controlling an electrical connection between an output node of the sense amplifier circuit and a one end of the first data line;
a second switch circuit controlling an electrical connection between an other end of the first data line and a one end of the second data line;
a third switch circuit controlling an electrical connection between an other end of the second data line and a first node;
a charge transfer transistor controlling a charge transfer between the first node and an input node of the read amplifier circuit in response to a control voltage applied to a gate terminal;
a first voltage setting circuit setting the first data line to a second voltage lower than the first voltage;
a second voltage setting circuit setting the second data line to the second voltage;
a control voltage generating circuit generating the control voltage having a fixed voltage obtained by adding the second voltage to a threshold voltage of the charge transfer transistor; and
a compensation capacitor formed at a line that supplies a the control voltage from the control voltage generating circuit to the charge transfer transistor,
wherein each of the second and third switch circuits includes a first transistor having a gate terminal, a source terminal and a drain terminal,
and a signal having a high-level voltage of a predetermined voltage is applied to the gate terminal of the first transistor, the predetermined voltage being the first voltage or being obtained by adding the second voltage to threshold voltage of the first transistor.

* * * * *